United States Patent [19]

Uekita et al.

[11] Patent Number: 5,043,248

[45] **Date of Patent: * Aug. 27, 1991**

[54] PHOTOSENSITIVE AMHILPHILIC HIGH POLYMERS AND PROCESS FOR PRODUCING THEM

[75] Inventors: Masakazu Uekita; Hiroshi Awaji, both of Hyogo, Japan

[73] Assignee: Kanegafuchi Kagaku Kogyo Kabushiki Kaisha, Osaka, Japan

[ * ] Notice: The portion of the term of this patent subsequent to Apr. 18, 2006 has been disclaimed.

[21] Appl. No.: 427,947

[22] Filed: Oct. 25, 1989

Related U.S. Application Data

[63] Continuation of Ser. No. 92,969, Sep. 3, 1987, abandoned.

[30] Foreign Application Priority Data

| | | | |
|---|---|---|---|
| Sep. 4, 1986 | [JP] | Japan | 61-208946 |
| Sep. 4, 1986 | [JP] | Japan | 61-208947 |
| Sep. 4, 1986 | [JP] | Japan | 61-208948 |

[51] Int. Cl.$^5$ .......................... G03C 1/73; G03F 7/039

[52] U.S. Cl. .................................... 430/270; 430/283; 528/350; 528/353; 528/188; 528/125

[58] Field of Search ................ 430/270, 283; 528/350, 528/353, 188, 125

[56] References Cited

U.S. PATENT DOCUMENTS

| | | | |
|---|---|---|---|
| 4,022,732 | 5/1977 | Schwarcz | 528/353 |
| 4,239,880 | 12/1980 | Darms | 528/125 |
| 4,243,743 | 1/1981 | Hiramoto et al. | 430/281 |
| 4,321,319 | 3/1982 | Shoji et al. | 430/270 |
| 4,416,973 | 11/1983 | Goff | 430/281 |
| 4,430,481 | 2/1984 | Goff | 430/288 |
| 4,551,522 | 11/1985 | Fryd et al. | 528/351 |
| 4,579,809 | 4/1986 | Irving | 430/283 |
| 4,595,745 | 6/1986 | Nakano et al. | 528/125 |
| 4,801,420 | 1/1989 | Uekita et al. | 264/298 |
| 4,822,853 | 4/1989 | Uekita et al. | 528/125 |

FOREIGN PATENT DOCUMENTS

| | | | |
|---|---|---|---|
| 0157930 | 3/1984 | European Pat. Off. . | |
| 0119719 | 9/1984 | European Pat. Off. . | |
| 0132221 | 1/1985 | European Pat. Off. . | |
| 0176710 | 4/1986 | European Pat. Off. . | |
| 0209114 | 1/1987 | European Pat. Off. . | |
| 0224680 | 6/1987 | European Pat. Off. . | |
| 0230539 | 8/1987 | European Pat. Off. . | |
| 0247358 | 12/1987 | European Pat. Off. . | |
| 0247637 | 12/1987 | European Pat. Off. . | |
| 2496111 | 6/1982 | France . | |
| 54-145794 | 11/1979 | Japan . | |
| 55-30207 | 8/1980 | Japan . | |
| 60-37550 | 2/1985 | Japan | 430/270 |
| 2014167 | 8/1979 | United Kingdom . | |
| WO80/0070 | 6/1980 | World Int. Prop. O. . | |
| WO81/01855 | 7/1981 | World Int. Prop. O. . | |

OTHER PUBLICATIONS

Patent Abstracts of Japan, vol. 7, No. 127 (P-201) [1272], 3rd Jun. 1983.

Chemical Abstracts, vol. 100, No. 10, 5th Mar. 1984, p. 10, Abstract No. 68897m, Columbus, Ohio, U.S.; A. I. Volozhin et al.

Chemical Abstracts, vol. 102, No. 26, 1st Jul. 1985, p. 6, abstract No. 221283w, Columbus, Ohio, U.S.; L. Minnema et al.

Alan K. Engel, Tomoko Yoden, Kohai Sanui, and Naoya Ogata, J. Am. Chem. Soc. (1985), 107, 8308–8310.

M. Suzuki, M. Kakimoto, T. Konishi, Y. Imai. M. Iwamoto and T. Hino, Chemistry Letters, (1986), 395–398.

M. Kakimoto, M. Suzuki, T. Konishi, Y. Imai, M. Iwamoto and T. Hino, Chemistry Letters, (1986), 823–826.

Alan K. Engel, Tomoko Yoden, Kohei Sanui and Naoya Ogata, Polymeric Materials Science and Engineering, 54, (1986), 119–123.

P. S. Vincett and G. G. Roberts, Thin Solid Films, 68, (1980), 135–171.

*Primary Examiner*—Marion E. McCamish
*Assistant Examiner*—Christopher D. RoDee
*Attorney, Agent, or Firm*—Armstrong, Nikaido, Marmelstein, Kubovcik & Murray

[57] ABSTRACT

A photosensitive amphiphilic high polymer comprises a linear recurring unit containing at least divalent 1st organic group ($R^1$) having at least two carbon atoms and at least divalent 2nd organic group ($R^2$) having at least two carbon atoms, said organic groups $R^1$ and $R^2$ being connected to each other by a divalent linkage group formed by a reaction of an acid group (A) containing a hetero atom and a basic group (B) containing a hetero group; and at least one hydrocarbon-containing group having 10 to 30 carbon atoms, which may have a substituent, bonded to said recurring unit by a covalent bond or an ionic bond; and a dimerizable or polymerizable unsaturated bond or an orthonitrobenzyl group

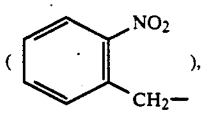

which may have a substituent, contained in a part or the whole of said recurring unit.

10 Claims, No Drawings

PHOTOSENSITIVE AMHILPHILIC HIGH POLYMERS AND PROCESS FOR PRODUCING THEM

This application is a continuation of application Ser. No. 092,969 filed Sept. 3, 1987, now abandoned.

FIELD OF THE INVENTION

This invention relates to a photosensitive amphiphilic high polymer and a process for producing the polymer. More particularly, the invention relates to a photosensitive amphiphilic high polymer which is modifed to enable the formation of film by a Langmuir-Blodgett's technique (hereinafter, is referred to as LB method) and has a structure of being dimerized or polymerized, or further decomposed by the irradiation of ultraviolet rays, X-rays, electron beams, etc., and a process for producing such a polymer.

BACKGROUND OF THE INVENTION

In the 1930's, it was found by Langmuir and Blodgett that a fatty acid having 16 to 22 carbon atoms could form a mono-molecular film on the surface of water and the film could be built up on a base material but the application of the built-up films has recently begun to be investigated.

The investigations made heretofore are summaried in *Kotai Butsuri* (*Solid Phisics*), (12), 45(1982), *Thin Solid Films*, 68, No. 1 (180), ibid, 99, Nos. 1, 2, and 3 (1983), G. L. Gains, *Insoluble Monolayers at Liquid-Gas Interfaces* (Interscience Publishers, New York, 1966), etc., but a Langmuir-Blogett's film (hereinafter, is referred to as LB film) by a conventional straight chain saturated fatty acid has a problem that the film is inferior in heat resistance and mechanical strength and hence it cannot be used for practical purpose as it is.

For overcoming the above problems, polymerizing polymer films formed by using unsaturated fatty acids such as ω-tricosenoic acid, ω-heptadecenoic acid, α-octadecylacrylic acid, etc., unsaturated esters of fatty acids such as vinyl stearate, octadecyl acrylate, etc., and diacetylene derivatives have been investigated but these films are yet insufficient in heat resistance as well as are not excellent in electric properties.

It is known that some of polymers having a hydrophilic group, such as polyacids, polyalcohols, ethyl acrylate, polypeptides, etc., have a film-forming property but these polymers have never been investigated as polymers modified, in particular, as materials for LB film, and these polymers cannot be used as excellent LB film materials.

On the other hand, polyimide is known for heat-resistive film but the thickness of a film formed by spin coating is at the best 1,000 Å or more, and usually 1 μm or more, in other words, it is very difficult to form a heat-resistive thin film of less than 1,000 Å having no pin holes by using such a polymer. Also, various photosensitive polyimides have been developed but it is also very difficult to obtain a thin film as described above even by using such polyimides.

SUMMARY OF THE INVENTION

An object of this invention is, therefore, to enable the formation of thin film by LB method by modifying a high polymer by which the formation of thin film by LB method is originally difficult.

Other object of this invention is to provide a photosensitive amphiphilic high polymer capable of forming a thin polymer film, the thickness of which is generally difficult to form, having improved mechanical properties such as heat resistance, chemical resistance, adhesive strength, etc., said thin polymer film being able to very easily form patterns by incorporating therein an unsaturated bond which is dimerized or polymerized by the irradiation of light such as ultraviolet rays, etc., or X-rays, electron beams, etc., or a structure of causing decomposition by the irradiation of the aforesaid light or rays.

A still other object of this invention is to provide a process for producing the above-described photosensitive amphiphilic high polymer.

That is, according to one embodiment of this invention, there is provided a photosensitive amphiphilic high polymer comprising a linear recurring unit containing at least divalent 1st organic group ($R^1$) having at least two carbon atoms and at least divalent 2nd organic group ($R^2$) having at least two carbon atoms, said organic groups $R^1$ and $R^2$ being connected to each other by a divalent linkage group formed by a reaction of an acid group (A) containing a hetero atom and a basic group (B) containing a hetero atom; at least one hydrocarbon-containing group having 10 to 30 carbon atoms, which may have a substituent, bonded to said recurring unit by a covalent bond or an ionic bond; and a dimerizable or polymerizable unsaturated bond or an orthonitrobenzyl group ( 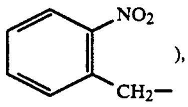 ), which may have a substituent, contained in a part or the whole of said recurring unit.

According to another embodiment of this invention, there is provided a process for producing a photosensitive amphiphilic high polymer, which comprises polymerizing a monomer containing at least divalent 1st organic group ($R^1$) having at least two carbon atoms and a monomer containing at least divalent 2nd organic group ($R^2$) having at least two carbon atoms in a combination of any one of those shown below;

$$A{-}(R^1){-}A + B{-}(R^2){-}B$$

$$A{-}(R^1){-}B + A{-}(R^2){-}B$$

$$B{-}(R^1){-}B + A{-}(R^2){-}A$$

(wherein, A represents an acid group containing a hetero atom, B represents a basic group containing a hetero atom, and when $R^1$ and $R^2$ are trivalent or more, said A and/or B is further bonded according to the valence number), at least one of the two kinds of monomers in the above combination containing at least one hydrocarbon-containing group having 12 to 30 carbon atoms, which may have a substituent, and a part or the whole of at least one of the monomer containing the 1st organic group $R^1$ and the monomer containing the 2nd organic group $R^2$ have dimerizable or polmerizable unsaturated bond, or an orthonitrobenzyl group, which may have a substituent.

DETAILED DESCRIPTION OF THE INVENTION

Then, the invention is explained in more detail.

The high polymer of this invention is a polymer or copolymer composed of $$(A—R^1—AB—R^2—B) \quad (101)$$

$$(A—R^1—BA—R^2—B) \quad (102)$$

$$(B—R^1—BA—R^2—A) \quad (103)$$

as a linear recurring unit, which becomes a fundamental skeleton.

In the above formulae, AB and BA are a divalent linking group formed by the reaction of an acid group A and a basic group B each containing a hetero atom such as O, N, S, P, B, etc. More specifically, AB and BA are a group formed by the reaction of an acid group such as —COOR (wherein, R represents an alkyl group or a hydrogen atom), —COX (wherein, X represents a chlorine group or a bromine group), —NCO, —NCS, —CONHR, —SO NHR, etc., and a basic group such as —NHR, —OR, —SR, —X, etc.

Specific examples of AB are

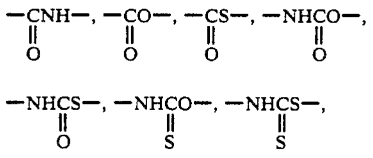

etc., and specific examples of BA are

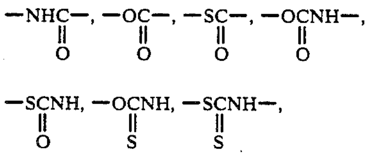

etc.

In formulae (101) to (103) described above, $R^1$ is at least divalent 1st organic group having at least two carbon atoms and $R^2$ is at least divalent 2nd organic group having at least two carbon atoms.

When $R^1$ and $R^3$ are trivalent or more, A and/or B, which does not take part in the formation of the linear recurring unit, is bonded thereto according to the valence number.

Then, $R^1$ and $R^2$ are explained in detail.

$R^1$ and $R^2$ are at least divalent group having at least two, and preferably 5 to 20 carbon atoms and may be an aliphatic group, an alicyclic group, an aromatic group, a group composed of a combination of the aforesaid groups, or the above-described groups substituted by a monovalent group having 1 to 30 carbon atoms (said monovalent group may further be substituted by a halogen atom, a nitro group, an amino group, a cyano group, a methoxy group, an acetoxy group, etc.) of an aliphatic group, an alicyclic group, or an aromatic group (these groups may be combined with each other) or containing —O—, —COO—, —NHCO—, —CO—, —S—, —CSS—, —NHCS—, —CS—, etc. However, the case that $R^1$ and $R^2$ are a group characterized by a benzenoid structure having at least 6 carbon atoms is preferred in terms of heat resistance, chemical resistance, mechanical properties, etc.

The term "benzenoid unsaturated structure" in this invention is used in contrast with a quinoid structure in relation to the structure of a carbon cyclic compound and is a structure same as a carbon ring contained in an ordinary aromatic compound.

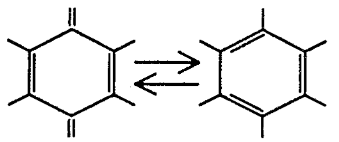

p-Quinoid Structure Benzenoid Unsaturated Structure

There is no particular restriction on the valence number of $R^1$ and $R^2$ but it is particularly preferred that $R^1$ and $R^2$ are divalent, trivalent or tetravalent and also at least one of them is trivalent or tetravalent.

Specific examples of such preferred $R^1$ and $R^2$ are as follows.

Example of Tetravalence

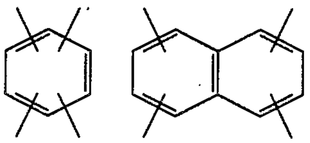

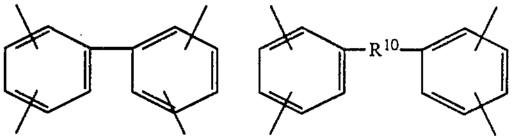

[wherein, $R^{10}$ represents $—(CH_2)_n—$ (wherein, n is 1 to 3),

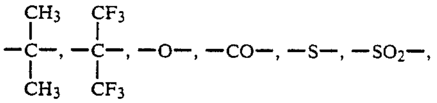

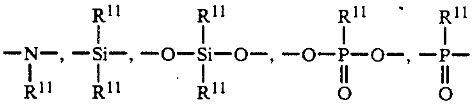

(wherein, $R^{11}$ represents an alkyl group or an aryl group)],

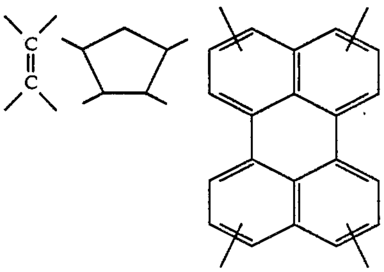

Examples of Trivalence

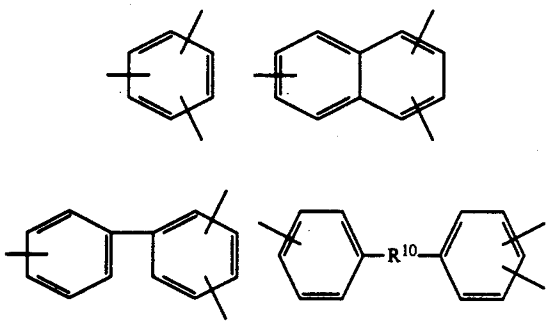

wherein, $R^{10}$ is same as defined above.

Examples of Divalence

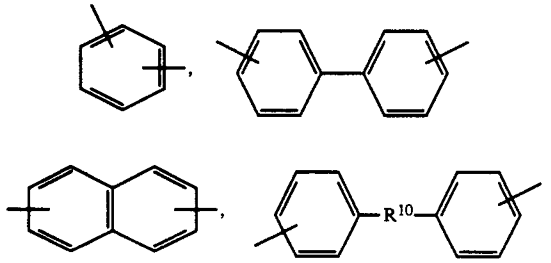

(wherein, $R^{10}$ is as defined above),

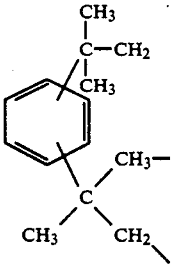

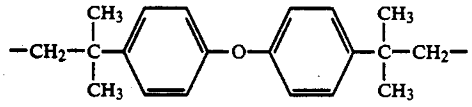

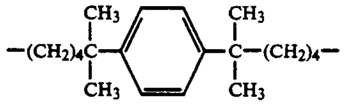

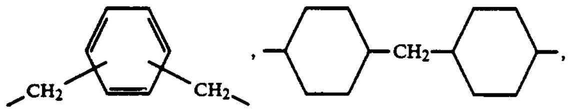

$-(CH_2)_p-$ (p = 2~10),

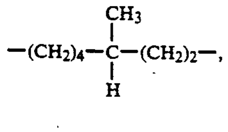

-continued

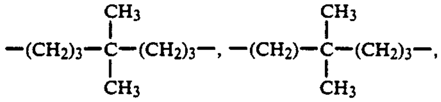

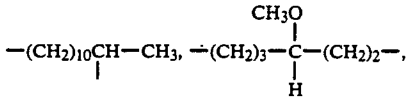

$-(CH_2)_3-O-(CH_2)_2-O-(CH_2)_3-$,

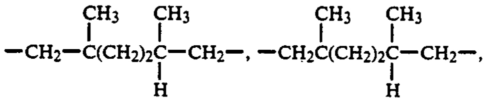

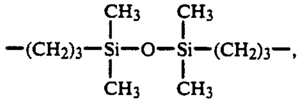

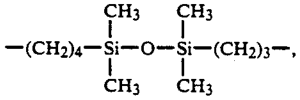

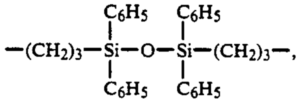

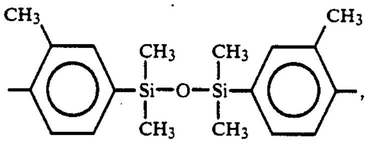

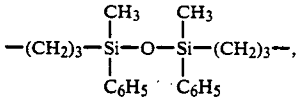

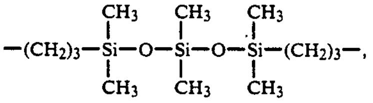

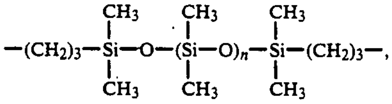

n = 2~15

There is no particular restriction on the position of the bonds corresponding to the valance number of $R^1$ and $R^2$, that is the bonds for forming the linear recuring unit and other bonding to the acid group A and/or the basic group B which are not used to form recurring units but the case that two of four bonds when $R^1$ and/or $R^2$ is tetravalent, and two of three bonds when $R^1$ and/or $R^2$ is trivalent exist at the adjacent two carbon atoms constituting $R^1$ and/or $R^2$ is advantageous for improving the heat resistance, mechanical properties, chemical resistance, etc., by causing cyclization by heating, chemical curing, etc., after forming film to form a 5-membered ring or 6-membered ring and hence is particularly preferred.

Specific examples of such preferred tetravalent or trivalent $R^1$ and $R^2$ are illustrated below although the invention is not limited to them.

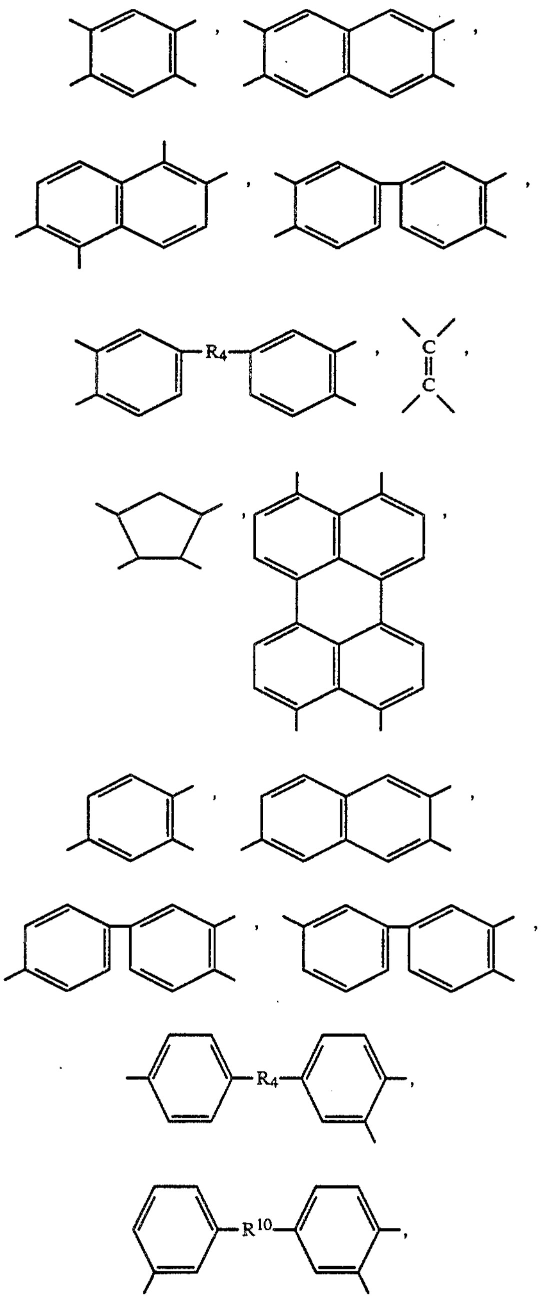

Then, the modification for enabling the high polymer having the recuring unit shown by formula (101) to (103) described above to form thin film by LB method is explained.

That is, such a modification is attained by introducing at least one, and preferably two hydrocarbon-containing groups $R^x$s having 10 to 30, and preferably 16 to 22 carbon atoms, said group may have a substituent, (hereinafter, the group is referred to as hydrophobicity imparting group) into the recuring unit shown by formula (101) to (103) by a covalent bond or an ionic bond to render the high polymer hydrophobic.

For realizing the aforesaid modification, there are following 4 methods.

[I] A method of bonding $R^x$ to the atom contained in the group, AB or BA in the linear recuring unit shown by formula (101) to (103) as a substituent.

[II] A method of directly bonding $R^x$ to $R^1$ and/or $R^2$ as substituent(s).

[III] A method of bonding $R^x$ to $R^1$ and/or $R^2$ in the linear recuring unit as substituent(s) through other A and/or B than A and/or B used for forming the linear recuring unit containing $R^1$ and $R^2$.

[IV] A method of bonding $R^x$ to $R^1$ and/or $R^2$ in the linear recuring unit as substituent(s) through other A and/or B than A and/or B for forming the linear recuring unit containing $R^1$ and $R^2$ by an ionic bond.

As a matter of course, methods [I], [II], [III], and [IV] may be employed as any desired combination thereof. Also when two or more groups $R^x$s exist, said $R^x$s may be the same or different.

Methods [I], [II], [III], and [IV] are practically illustrated below.

Method [I]

| AB | BA |
|---|---|
| 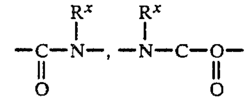 | 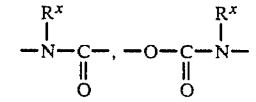 |
| 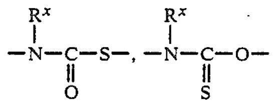 | 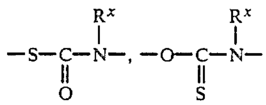 |
| 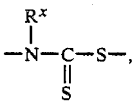, etc. | 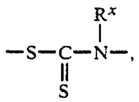, etc. |

In method [I], the hydrogen atom on the nitrogen atom of AB or BA is substituted for $R^x$ as shown in the above table.

Method [II] is a process of directly bonding $R^x$ to $R^1$ and/ $R^2$ as substituent(s) and specific examples thereof are as follows.

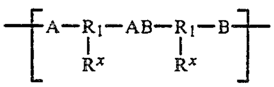

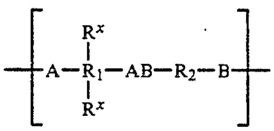

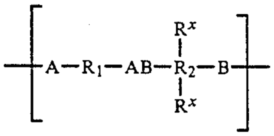

In method [III], at least one at least trivalent organic group is used as $R^1$ and/or $R^2$ and $R^x$ is bonded to such $R^1$ and/or $R^2$ as substituent(s) through other A and/or B than A and/or B used for forming the linear recurring unit containing $R^1$ and $R^2$. For example, in each of the following recuring units

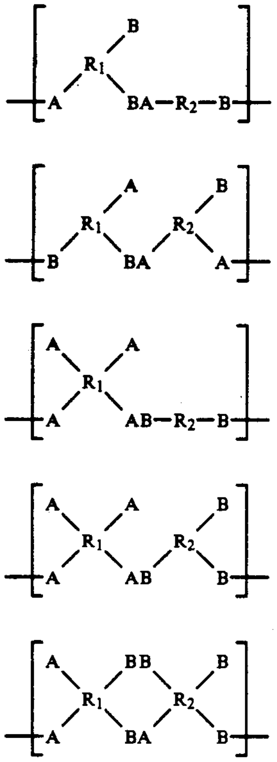

$R^x$ is bonded to $R^1$ and/or $R^2$ as substituent(s) through A and/B which is not used for making the linear recurring unit. For example, in the case of bonding through such A, $R^x$ is bonded to $R^1$ or $R^2$ as $-COOR^x$, $-CONHR^x$, $-NHCOOR^x$, $-NHCSOR^x$, etc., and in the case of bonding through such B, $R^x$ is bonded as $-NHR^x$, $-OR^x$, $-SR^x$, etc.

In method [IV], $R^x$ is bonded through A and/or B which is not used for making the linear recuring unit as in method [IV] in such a manner that $R^x$ bonded to B is bonded to A and $R^x$ bonded to A is bonded to A by an ionic bond.

For example, if A is $-COOH$, $R^x$ is bonded by the following ionic bond

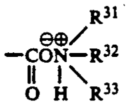

wherein, $R^{31}$, $R^{32}$, and $R^{33}$ each represents a hydrocarbon-containing group having 1 to 30 carbon atoms, which may have a substituent, or a hydrogen atom, at least one of said $R^{31}$, $R^{32}$, and $R^{33}$ being $R^x$).

On the other hand, if B is $-NH_2$, $-NHR^{91}$, or

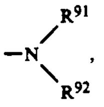

$R^x$ is bonded by the following ionic bond

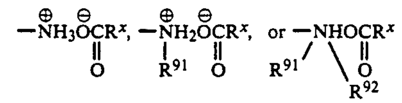

wherein, $R^{91}$ and $R^{92}$ each represents a hydrocarbon-containing group having 1 to 30 carbon atoms, which may have a substituent, or a hydrogen atom, and is preferably a hydrocarbon-containing group having 1 to 4 carbon atoms or a hydrogen atom.

In the case of improving heat resistance, etc., by performing a cyclization reaction by means such as heating, chemical curing, etc., after forming film, $R^x$ bonded by other method than method [II] is removed at the cyclization reaction. On the other hand, $R^x$ bonded by method [II], that is, $R^x$ directly bonded to $R^1$ or $R^2$ is not released at the cyclization reaction and is left in the LB film. Since the existence of $R^x$ is disadvantageous for heat resistance, etc., the employment of method [I], [III], or [IV] is preferred from the view point of heat resistance, etc.

Then, the hydrophobicity imparting group $R^x$ is practically explained.

$R^x$ is a hydrocarbon-containing group having 10 to 30, and preferably 16 to 22 carbon atoms and preferred examples thereof are a monovalent group selected from aliphatic groups, alicyclic group, aromatic groups, groups formed by bonding the aforesaid groups to each other, and substituted ones of these groups. Specific examples are illustrated as follows;

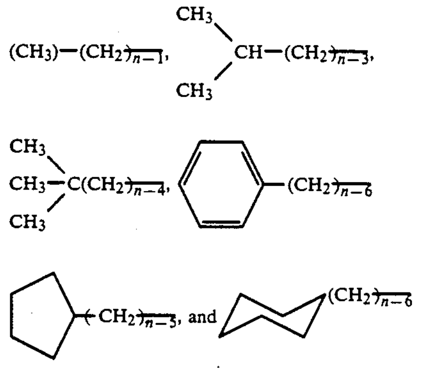

wherein, n is 12 to 20, and preferably 16 to 22, and a straight chain aliphatic hydrocarbon group is a particularly preferred example.

Examples of the substituent for the aforesaid groups are a halogen atom, a nitro group, an amino group, a cyan group, a methoxy group, an acetoxy group, etc., although they are not inevitable. However, it is as the case of preferred to use a fluorine atom as the substituent since fluorine atom more improves the hydrophobicity than hydrogen atom.

In other words, by the incorporation of fluorine atom, the length of the alkyl chain can be shortened. For example, it is generally necessary that the carbon atom number is at least 12 but in $C_8F_{17}(CH_2)_k$, it is sufficient that k is 2, that is, carbon number 10 enables the film forming. Furthermore, for imparting photosensitivity to the high polymer of this invention, at least a part, i.e., at least 5%, and preferably at least 30% of the recurring unit contains a structure having an unsaturated bond which is dimerized or polymerized by the irradiation of light such as ultraviolet rays, etc., X-rays, electron beam, etc., or contains a structure of being decomposed by the irradiation of light such as ultraviolet rays, etc., X-rays, electron beams, etc.

When the recurring unit contains a structure of being dimerized or polymerized by the irradiation of light, etc., the high polymer becomes a negative type photosensitive compound and when the recurring unit contains a structure of being decomposed, the high polymer becomes a positive type photosensitive compound.

First, the negative type photosensitive compound is explained.

In the negative type photosensitive compound of this invention, at least 5%, and preferably at least 30% of the recurring unit thereof has a group having an unsaturated structure capable of being dimerized or polymerized by the irradiation of light such as ultraviolet rays, etc., X-rays, electron beams, etc., in the recurring unit (hereinafter, the group is referred as negative type photosensitive group).

Examples of such a negative type photosensitive group are as follows:

$CH_2{=}CH-$, $CH_2{=}CH-CH_2-$,

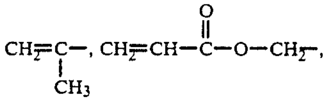

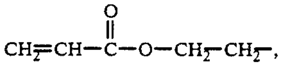

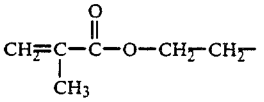

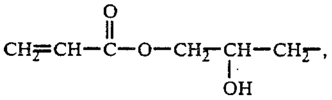

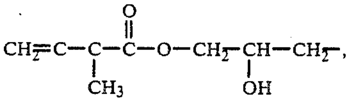

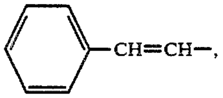

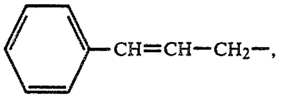

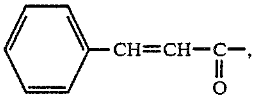

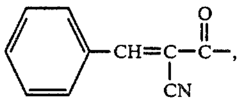

-continued

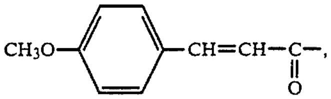

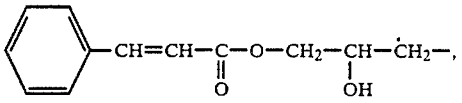

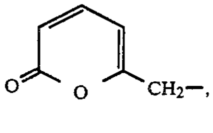 , 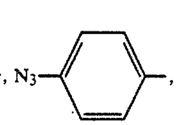 , and

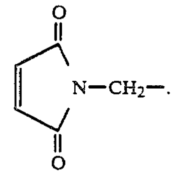

Furthermore, by bonding a structure having an unsaturated bond to the above-described hydrophobicity imparting group $R^x$, a group having both a hydrophobicity and dimerizability or polymerizability (hereinafter, is referred to as hydrophobic negative type photosensitive group) can be obtained. Examples of such a group are as follows.

$CH_2{=}CH(CH_2)_n-$, $CH_3(CH_2)_lC{\equiv}C-C{\equiv}C(CH_2)_m-$, (l + m + l = n)

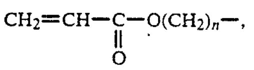

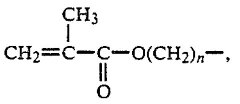

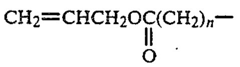

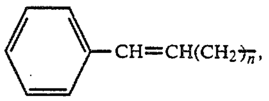

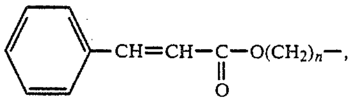

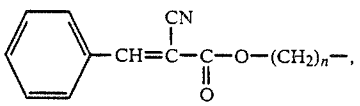

-continued

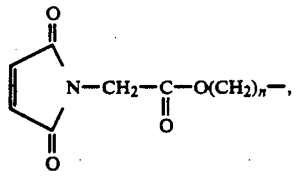

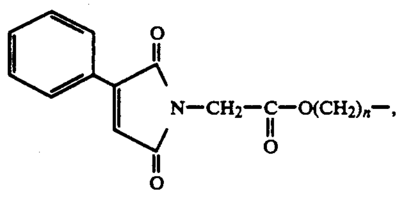

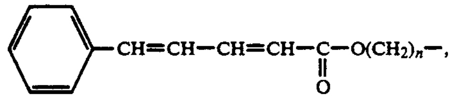

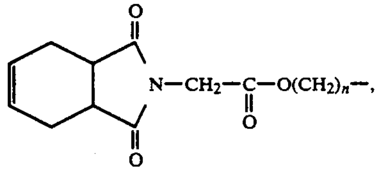

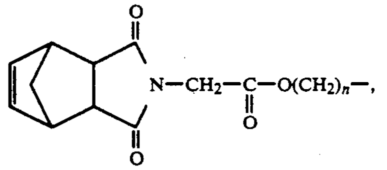

wherein n is 12 to 30, preferably 16 to 22.

For introducing the negative type photosensitive group, any one of Processes [I], [II], [III], and [IV] described above for introducing the aforesaid hydrophobicity imparting group $R^x$ can be ultilized.

In these processes, the group directly bonded to $R^1$ or $R^2$ by Process [II] has preferably a carbon atom number as small as possible from the view point of heat resistance since the group remains in the film without being released at the cyclization reaction after the film formation. In the case of bonding the hydrophobic negative photosensitive group by other process than Process [II], it is preferred to use the negative type photosensitive group having a large carbon atom number since the group is removed by releasing at the cyclization reaction. Also, by the same reason as above, the employment of Process [I], [III], or [IV] is preferred from the view point of heat resistance, etc.

Then, a positive type photosensitive compound is explained.

In the positive type photosensitive compound of this invention, at least 5%, and preferably at least 30% of the recurring unit thereof has at least one group having a structure of being decomposed by the irradiation of light such as ultraviolet rays, etc., X-rays, electron beams, etc., practically an orthonitrobenzyl group, which may have a substituent, (hereinafter, the group is referred to as positive type photosensitive group) in the recurring unit. By using the above-described hydrophobicity imparting group as the substituent for the orthonitrobenzyl group, the positive type photosensitive group can be provided with hydrophobicity and decomposability (hereinafer, the group is referred to as hydrophobic positive type photosensitive group).

Such a positive type photosensitive group can be introduced to the recurring unit by selecting a compound having a recurring unit containing at least one carboxy group and substituting the hydrogen atom of the carboxy group for the positive type photosensitive group.

There is no particular restriction about the molecular weight of the high polymer of this invention.

A thin film can be formed by the LB method even if the molecular weight of the high polymer is low. However, good heat resistance, mechanical strength and chemical resistance cannot be obtained if the molecular weight is low. On the other hand, if the molecular weight is too large, the viscosity becomes too high to form a desired thin film. Accordingly, the number average molecular weight is preferably from about 2,000 to about 300,000, and more preferably from about 10,000 to about 150,000.

Specific examples of the preferred photosensitive amphiphilic high polymer of this invention are polyamic acids (and the esters or salts thereof) in the polymer or copolymer having the recurring unit represented by following formula (1), (2), (3), or (4)

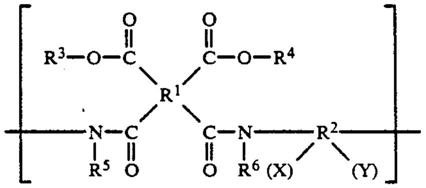

(1)

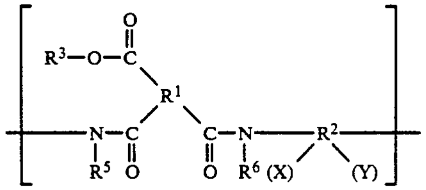

(2)

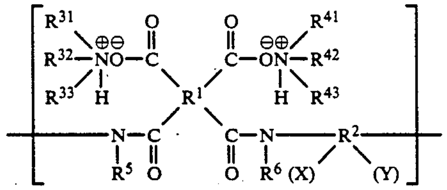

(3)

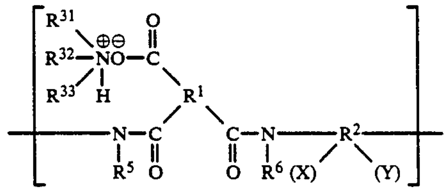

(4)

(wherein, $R^1$ represents the aforesaid trivalent or tetravalent group having at least two carbon atoms; $R^2$ represents a divalent, trivalent, or tetravalent group having at least two carbon atoms; when $R^2$ is trivalent, X is bonded to $R^2$ and when $R^2$ is tetravalent, X and Y are bonded to $R^2$; X and Y each represents an acid group A containing a hetero atom, said group may have a substituent, or a basic group B containing a hetero atom, said group may have a substituent, and $R^3$, $R^4$, $R^5$, $R^6$, $R^{31}$, $R^{32}$, $R^{33}$, $R^{41}$, $R^{42}$, and $R^{43}$ each represents a hydrocarbon group having 1 to 30 carbon atoms, said group may have a substituent, or a hydrogen atom), wherein at least one, and preferably two of said $R^3$, $R^4$, $R^5$, $R^6$, $R^{31}$, $R^{32}$, $R^{33}$, $R^{41}$, $R^{42}$, and $R^{43}$ are the above-desribed hydrophobicity imparting group $R^x$ having 10 to 30 carbon atoms, and preferably 16 to 22 carbon atoms and at least 5%, and preferably at least 30% of the recurring unit contains the negative type or positive type photosensitive group in the recurring unit.

$R^1$ and $R^2$ in formulae (1), (2), (3), and (4) described above are as described above but it is particualrly preferred that at least one of $R^1$ and $R^2$ is a group having a benzenoid structure having at least 6 carbon atoms.

Furthermore, it is particularly preferred that when $R^1$ and/or $R^2$ is tetravalent, each two bonds of four bonds bonded to $R^1$ and/or $R^2$ exist in two adjacent carbon atoms constituting $R^1$ and/or $R^2$ to form a precursor of a 5-membered ring or 6-membered ring structure, and when $R^1$ and/or $R^2$ is trivalent, each two bonds of three bonds bonded to $R^1$ and/or $R^2$ exist in two adjacent two carbon atoms to form a precursor of a 5-membered ring or 6-membered ring structure.

$R^3$, $R^4$, $R^5$, $R^6$, $R^{31}$, $R^{32}$, $R^{33}$, $R^{41}$, $R^{42}$, and $R^{43}$ each is a hydrogen atom or a group having 1 to 30, and preferably 1 to 22 carbon atoms, which may be an aliphatic group, an aromatic group, a group formed by the combination of the aforesaid groups, the aforesaid groups substituted by a monovalent group having 1 to 30 group such as an aliphatic group, an alicyclic group, and an aromatic group (they may be combined with each other) (said monovalent group may be substituted by a halogen atom, a nitro group, an amino group, a cyano group, a methoxy group, an acetoxy group, etc.), or a group containing —O—, —COO—, —NHCO—, —CO—, —S—, —CSS—, —NHCS—, —CS—, etc.

It is necessary that at least one, and preferably two of $R^3$, $R^4$, $R^5$, $R^6$, $R^{31}$, $R^{32}$, $R^{33}$, $R^{41}$, $R^{42}$, and $R^{43}$ are the above-described hydrophobicity imparting group $R^x$.

The amphiphilic photosensitive high polymer of this invention are explained more practically.

First, the negative type photosensitive amphiphilic high polymer having the recurring unit shown by formula (1) described above is explained.

$R^1$ and $R^2$ are as described above and it is particularly preferred that at least one of $R^1$ and $R^2$ has a group having a benzenoid structure and has a precursor structure that the position of bond is disposed at a position capable of forming a 5-membered ring or a 6-membered ring. Also, it is preferred that at least one, and preferably two of $R^3$, $R^4$, $R^5$, and $R^6$ are the above-described hydrophobicity imparting group. As a matter of course, the hydrophobicity imparting group may be bonded to $R^2$ directly or through X and Y bonded to $R^2$.

Furthermore, the case that said $R^3$ and $R^4$ or said $R^5$ and $R^6$ are all hydrogen atoms is preferred from the points that the polymer can be easily producted and the cost is low.

As to the negative type photosensitive group, at least one of $R^3$, $R^4$, $R^5$, and $R^6$ at a part or the whole of the recurring unit may be a negative type photosensitive group or at least one of negative type photosensitive groups may be bonded to $R^2$ directly or through X or Y bonded to $R^2$ at a part or the whole or the recurring unit.

In the polyamic acids and the esters thereof having a preferred precursor structure of the recurring unit shown by formula (1) described above, the polyimide precursors, wherein $R^2$ is divalent, show by the formula (1A)

(1A)

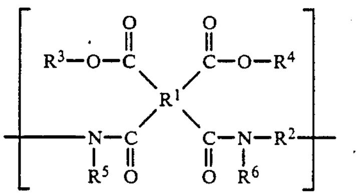

wherein, $R^1$, $R^2$, $R^3$, $R^4$, $R^5$, and $R^6$ are same as in formula (1) are typical examples of the polyamic acids and the esters thereof of this invention.

Specific examples of the preferred amphiphilic polyamide precursors of this invention are as follows.

(16)

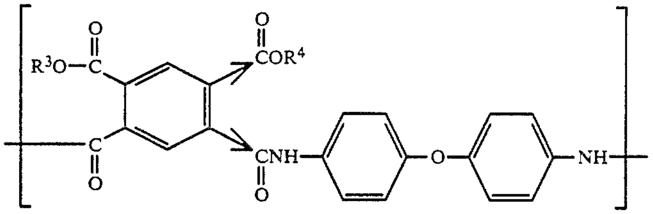

wherein, $R^3$ and $R^4$ are the above-described hydrophobicity imparting group $R^x$ and at least one of $R^3$ and $R^4$ of a part or the whole of the recurring unit is the above-described hydrophobic negative type photosensitive group.

(17)

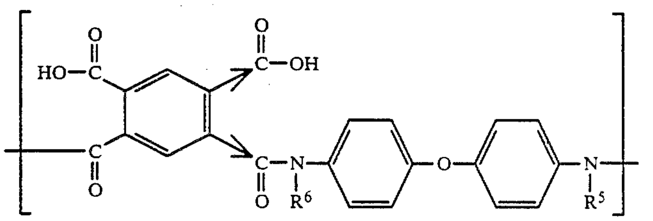

wherein, $R^5$ and $R^6$ are the above-described hydrophobicity imparting group $R^x$ and at least one of $R^5$ and $R^6$ of a part of the whole of the recurring unit is the above-described hydrophobic negative type photosensitive group.

(18)

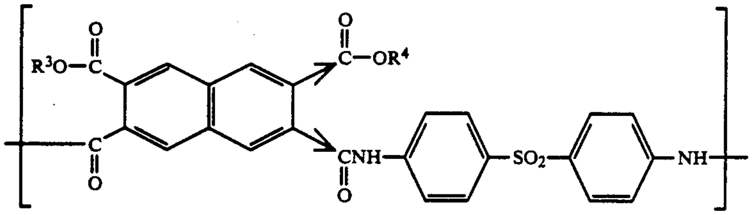

wherein, $R^3$ and $R^4$ are the above-described hydrophobicity imparting group $R^x$ and at least one of $R^3$ and $R^4$ of a part or the whole of the recurring unit is the above-described hydrophobic negative type photosensitive group.

(19)

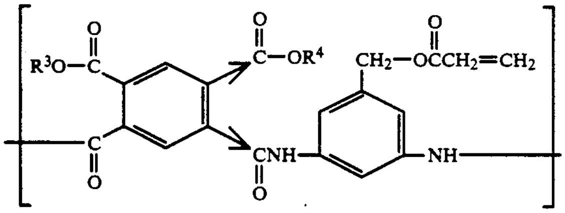

wherein, $R^3$ and $R^4$ are the above-described hydrophobicity imparting group $R^x$.

Furthermore, examples of the polyimide precursors shown by formula (1A) described above, wherein $R^3$, $R^4$, $R^5$, and $R^6$ are not hydrogen atom are those shown by the following formula;

(20)

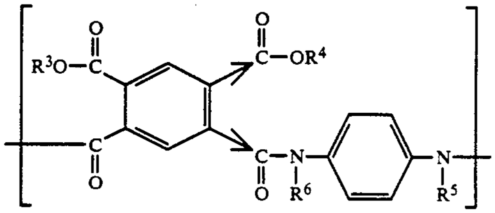

wherein, $R^3$ and $R^4$ are the aforesaid hydrophobicity imparting group $R^x$, $R^5$ and $R^6$ are an alkyl group having 1 to 6 carbon atoms, and at least one of $R^3$ and $R^4$ of a part or the whole of the recurring unit is the aforesaid hydrophobic negative type photosensitive group.

Furthermore, preferred specific examples of formula (1), wherein $R^2$ is trivalent or tetravalent are as follows.

(21)

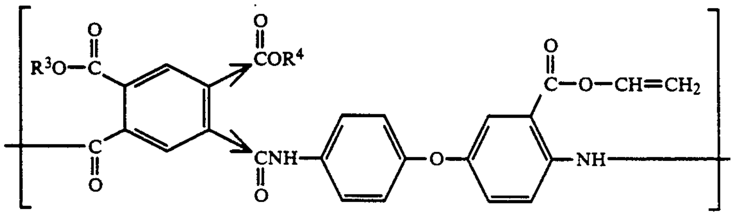

wherein, $R^3$ and $R^4$ are the above-described hydrophobicity imparting group $R^x$.

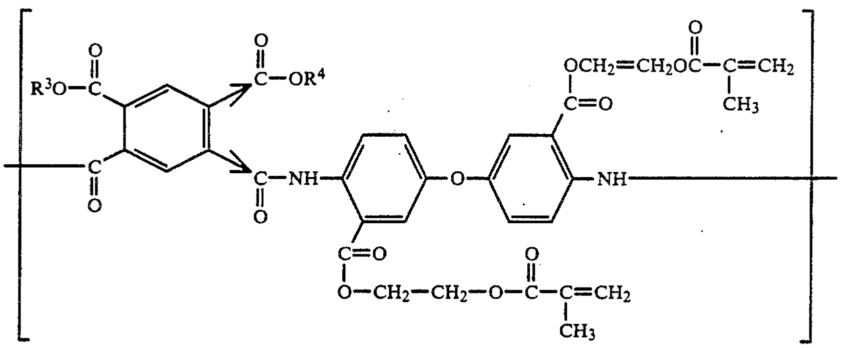
(22)

wherein, $R^3$ and $R^4$ are the above-described hydrophobicity imparting group $R^x$.

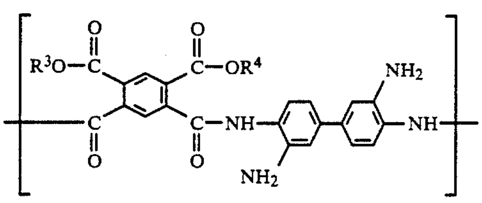
(23)

wherein, $R^3$ and $R^4$ are same as $R^3$ and $R^4$ in formula (16) described above.

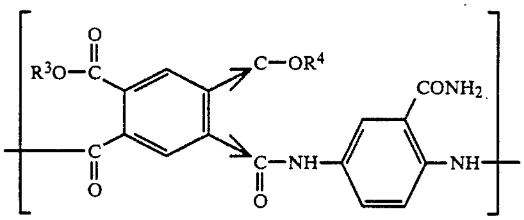
(24)

wherein, $R^3$ and $R^4$ are same as $R^3$ and $R^4$ in formula (16) described above.

Then, preferred specific examples of the negative type polyamic acids and the esters thereof having the recurring unit shown by formula (2) described above are those shown by the following formula;

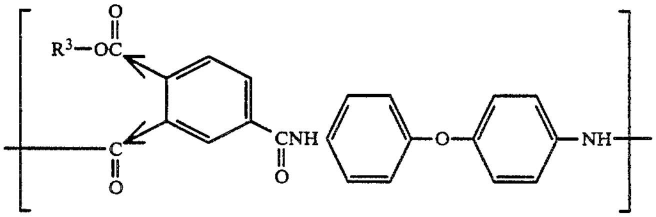
(25)

wherein, $R^3$ is the above-described hydrophobicity imparting group $R^x$ and $R^3$ of a part or the whole of the recurring unit is the above-described hydrophobic negative type photosensitive group.

Then, the negative type photosensitive polyamic acid salts shown by formula (3) described above are explained.

$R^1$ and $R^2$ are as explained above and it is particularly preferred that at least one of $R^1$ and $R^2$ is a group having a benzenoid structure and has a precursor structure that the position of the bond is dispsoed at the position of forming a 5-membered ring or 6-membered ring.

Also, it is preferred that at least one, and preferably two of $R^{31}$, $R^{32}$, $R^{33}$, $R^{41}$, $R^{42}$, $R^{43}$, $R^5$, and $R^6$ are the above-described hydrophobicity imparting group.

As a matter of course, the hydrophobicity imparting group may be bonded to $R^2$ directly or through X or Y bonded to $R^2$.

Furthermore, the case that $R^5$ and $R^6$ are all hydrogen atoms is particularly preferred since the high polymer can be produced easily and the cost is low.

As to the negative type photosensitive group, at least one of $R^{31}$, $R^{32}$, $R^{33}$, $R^{41}$, $R^{42}$, $R^{43}$, $R^5$, and $R^6$ at a part or the whole of the recurring unit is the negative type photosensitive group or at least one of the negative type photosensitive groups may be bonded to $R^2$ directly or through A or Y bonded to $R^2$ at a part or the whole of the recurring unit as in the case of formulae (1) and (2) described above.

It is preferred that one or two of $R^{31}$, $R^{32}$, $R^{33}$, $R^{41}$, $R^{42}$, $R^{43}$, $R^5$, and $R^6$ are the above-described hydrophobicity imparting group $R^x$ and when at least one of them is replaced with the negative type photosensitive group, it is the hydrophobic negative type photosensitive group.

In the polyamic acid salts having the preferred precursor structure having the recurring unit shown by formula (3) described above, the polyimide precursor shown by formula (3A), wherein $R^2$ is divalent,

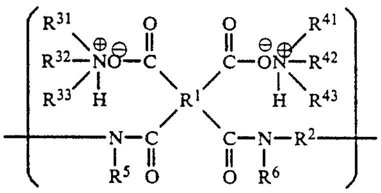
(3A)

wherein, $R^1$, $R^2$, $R^5$, $R^6$, $R^{31}$, $R^{32}$, $R^{33}$, $R^{41}$, $R^{42}$, and $R^{43}$ are same as those in formula (3)) are typical examples of the polyamic acid salts of this invention.

Specific examples of such preferred polyimide precursors of this invention are shown below.

(26)

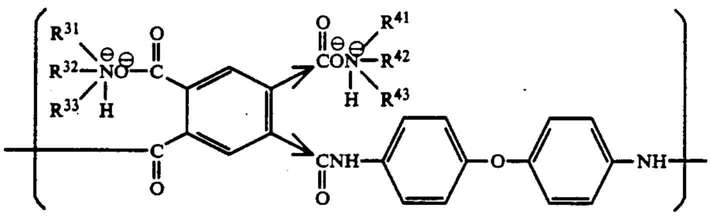

wherein, $R^{31}$ and $R^{41}$ are the above-described hydrophobicity imparting group $R^x$, $R^{32}$, $R^{33}$, $R^{42}$, and $R^{43}$ are a hydrogen atom or an alkyl group having 1 to 6 carbon atoms, and $R^{31}$ and $R^{41}$ of a part and the whole of the recurring unit are the above-described hydrophobic photosensitive group.

(27)

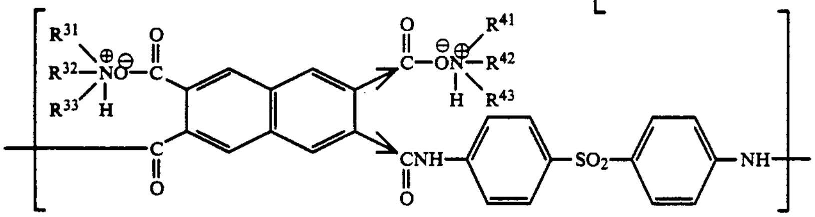

wherein, $R^{31}$, $R^{32}$, $R^{33}$, $R^{41}$, $R^{42}$, and $R^{43}$ are same as those in formula (26) and $R^{31}$ and $R^{41}$ of a part or the whole of the recurring unit are the above-described photosensitive group.

(28)

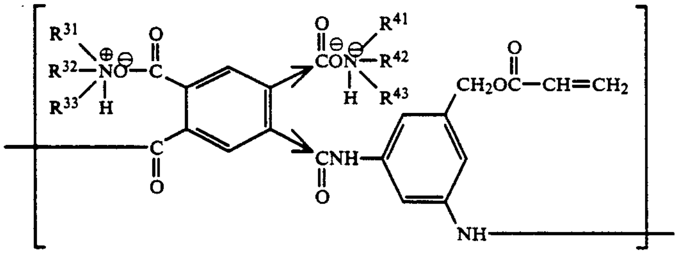

wherein, $R^{31}$ and $R^{41}$ are the above-described hydrophobicity inparting group $R^x$, and $R^{32}$, $R^{33}$, $R^{42}$ and $R^{43}$ are a hydrogen atom or a alkyl group having 1 to 6 carbon atoms.

Furthermore, examples of formula (3A), wherein $R^5$ and $R^6$ are not hydrogen atoms are as follows;

(29)

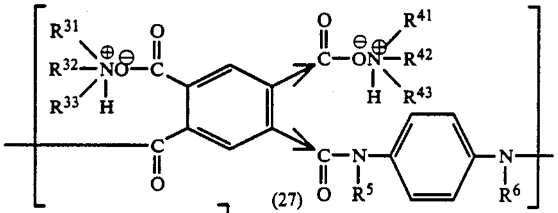

wherein, $R^{31}$ and $R^{41}$ are a hydrocarbon group having 1 to 11 carbon atoms, $R^{32}$, $R^{33}$, $R^{42}$, and $R^{43}$ are a hydrogen atom or an alkyl group having 1 to 6 carbon atoms, $R^5$ and $R^6$ are the above-described hydrophobicity imparting group $R^x$, and at least one of $R^{31}$ and $R^{41}$ of a part or the whole of the recurring unit is the negative type photosensitive group having 1 to 11 carbon atoms.

Still further, specific examples of the preferred precursor shown by formula (3), wherein $R^2$ is trivalent or tetravalent are as follows:

(30)

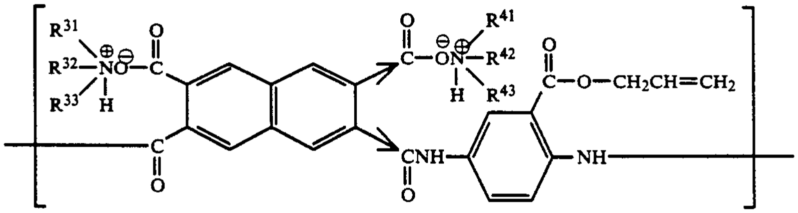

wherein, $R^{31}$, $R^{32}$, $R^{33}$, $R^{41}$, $R^{42}$, and $R^{43}$ are same as those in formula (28).

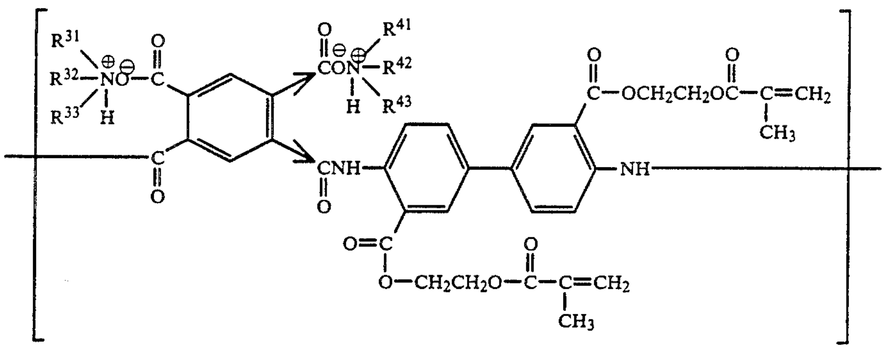
(31)

wherein, $R^{31}$, $R^{32}$, $R^{33}$, $R^{41}$, $R^{42}$, and $R^{43}$ are same as those in formula (28) described above.

Then, preferred specific examples of the negative type polyamic acid salts having the recurring unit shown by formula (4) described above are those shown by the following formula:

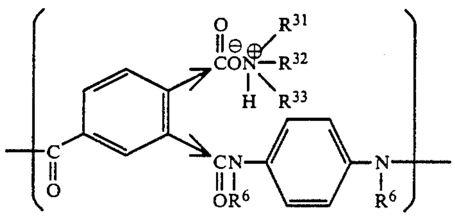
(32)

wherein, $R^{31}$ is a hydrocarbon group having 1 to 11 carbon atoms, $R^{32}$ and $R^{33}$ are a hydrogen atom or an alkyl group having 1 to 6 carbon atoms, $R^5$ and $R^6$ are the above-described hydrophobicity imparting group $R^x$, and $R^{31}$ of a part or the whole of the recurring unit is the negative type photosensitive group.

Then, the positive type amphiphilic high polymer having the recurring unit shown by formula (1), (2), (3), or (4) described above is explained.

Such a positive type photosensitive amphiphilic high polymer is generally obtained by introducing the above-described positive type photosensitive group into a part or the whole of recurring unit of the amphiphilic polymer having the recurring unit shown by formula (1), (2), (3) or (4), but it is preferred that a part or the whole of the recurring unit of polyamic acid or the ester thereof shown by formula (1) or (2) is a recurring unit shown by following (12), (12'), or (13), wherein $R^3$ and/or $R^4$ in formula (1) or (2) is an orthonitrobenzyl group which may have a substituent;

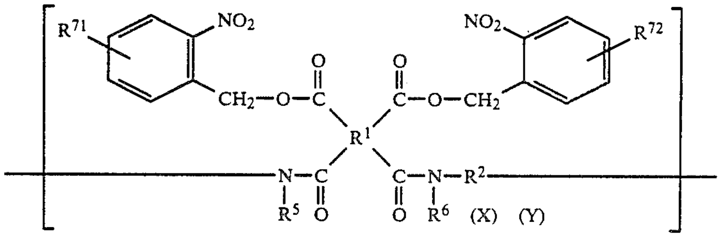
(12)

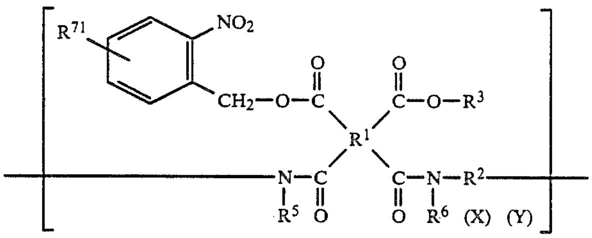
(12')

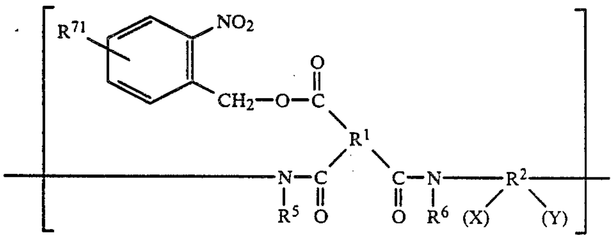
(13)

wherein, $R^1$, $R^2$, $R^3$, $R^4$, $R^5$, X and Y are as defined in formula (3) described above and $R^{71}$ and $R^{72}$ have the same significance as defined on $R^3$, $R^4$, $R^5$, and $R^6$, since in this case the production is easy and the cost is low.

Then, the recurring units shown by formula (12), (12'), and (13) are explained more practically.

$R^1$ and $R^2$ are as described above and it is preferred that at least one of $R^1$ and $R^2$ is a group having a benzenoid structure and has a precursor structure that the position of the bond is at the position capable of forming a 5-membered ring or a 6-membered ring.

It is preferred that at least one, and preferably two of $R^{71}$, $R^{72}$, $R^3$, $R^5$, and $R^6$ are the above-described hydrophobicity imparting group $R^x$ but the hydrophobicity imparting group may be bonded to $R^2$ directly or through X or Y bonded to $R^2$.

Furthermore, the case that said $R^{71}$ and $R^{72}$, said $R^{71}$ and $R^3$, or said $R^5$ and $R^6$ are all hydrogen atoms is particularly preferred since in this case, the production is easy and the cost is low.

In particular, in the above-described preferred precursors shown by formula (12), the polyimide precursors shown by following formula (12A), wherein $R^2$ is divalent;

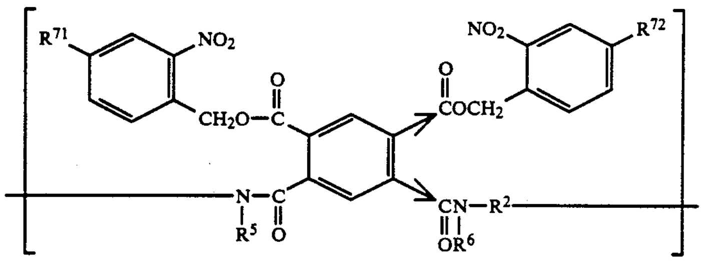

(12A)

wherein, $R^1$, $R^2$, $R^5$, $R^6$, $R^{71}$, and $R^{72}$ are same as those in formula (12) are recurring units giving typical polyamic acid esters of this invention.

Specific examples of the recurring units giving such positive type photosensitive polyimide precursors are as follows:

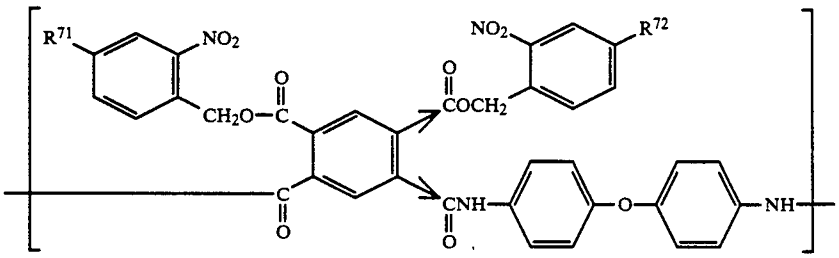

(33)

wherein, $R^{71}$ and $R^{72}$ are the above-described hydrophobicity imparting group $R^x$.

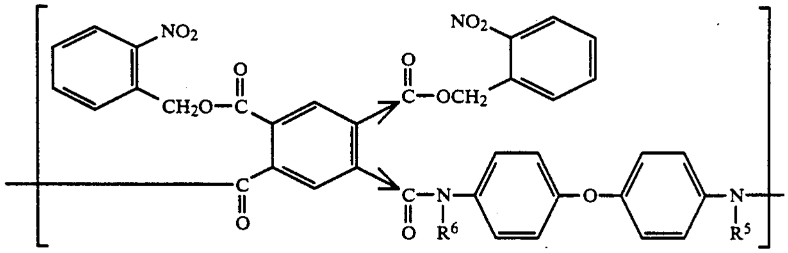

(34)

wherein, $R^5$ and $R^6$ are the above-described hydrophobicity imparting group $R^x$.

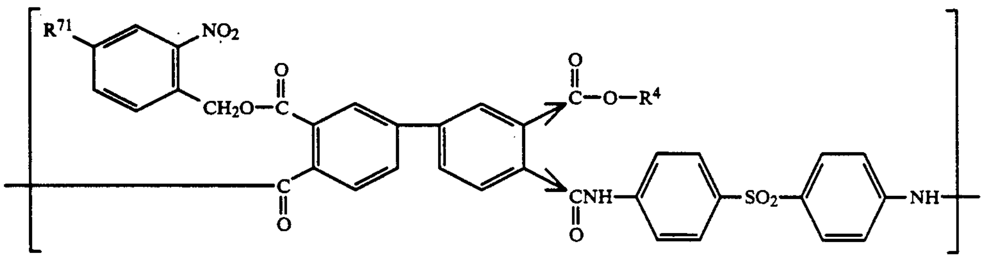

(35)

wherein, $R^{71}$ and $R^4$ are the above-described hydrophobicity imparting group $R^x$.

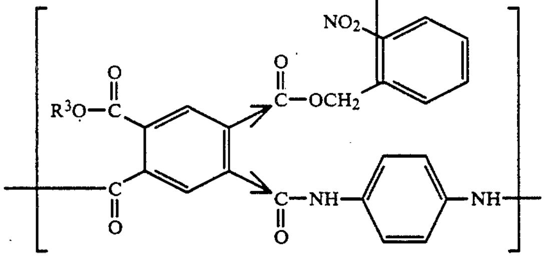
(36)

wherein, $R^3$ is the above-described hydrophobicity imparting group $R^x$.

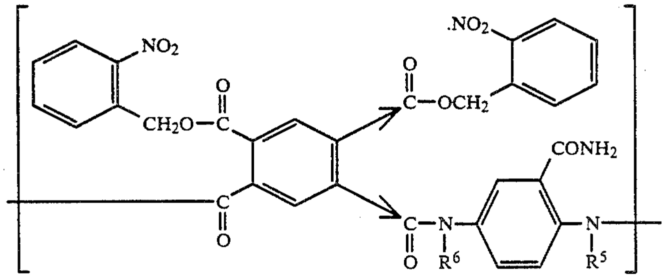
(37)

wherein, $R^5$ and $R^6$ are the above-described hydrophobicity imparting group $R^x$.

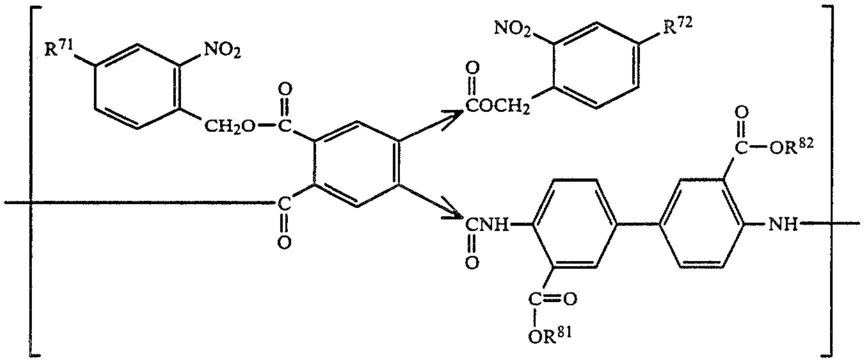
(38)

wherein, $R^{71}$ and $R^{72}$ are an alkyl group having 1 to 6 carbon atoms, and $R^{81}$ and $R^{82}$ are the above-described hydrophobicity imparting group $R^x$.

Furthermore, preferred specific examples of the recurring unit shown by formula (13) described above are those shown by the following formula;

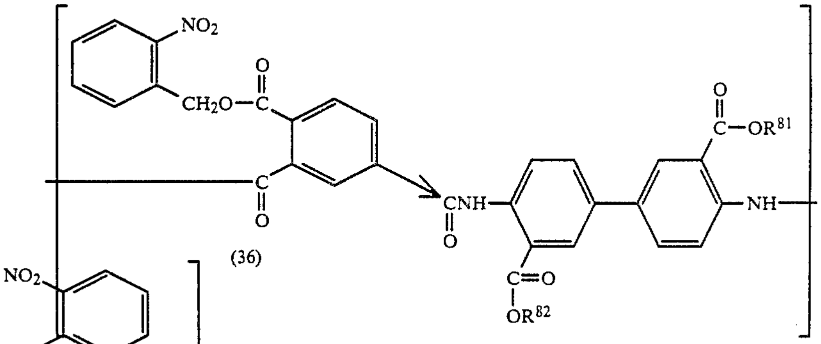
(39)

wherein, $R^{81}$ and $R^{82}$ are the above-described hydrophobicity imparting group $R^x$.

Still further, specific examples of the preferred photosensitive amphiphilic polymer having other recurring unit than those shown by formulae (1) to (4) described above are those shown by the following formula;

(40)

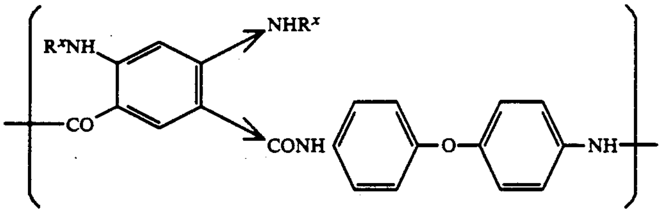

wherein, $R^x$ is the hydrophobicity imparting group defined above and at least one of $R^x$s in a part or the whole of recurring unit is the hydrophobic negative photosensitive group.

In the formulae (16) to (40) described above, the symbol—→shows isomerizm. For example, the following formula

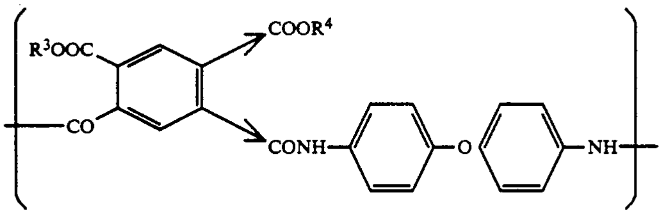

means (a)

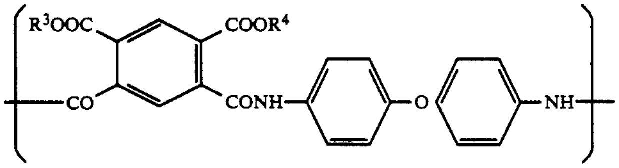

and (b)

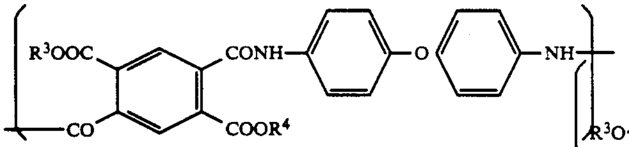

This invention includes the case that (a) or (b) exists alone and the case that both (a) and (b) exist together.

In the photosensitive amphiphilic polymers described above, when only a part of the recurring unit contains the negative type or positive type photosensitive group, the polymer becomes a copolymer of the recurring unit containing the negative type or positive type photosensitive group and the recurring unit containing no such photosensitive group. But, there are various copolymers in addition to the aforesaid copolymer.

For example specific examples of the copolymer composed of the recurring units shown by formula (1), wherein $R^1$ differs in each recurring unit is as follows.

(41)

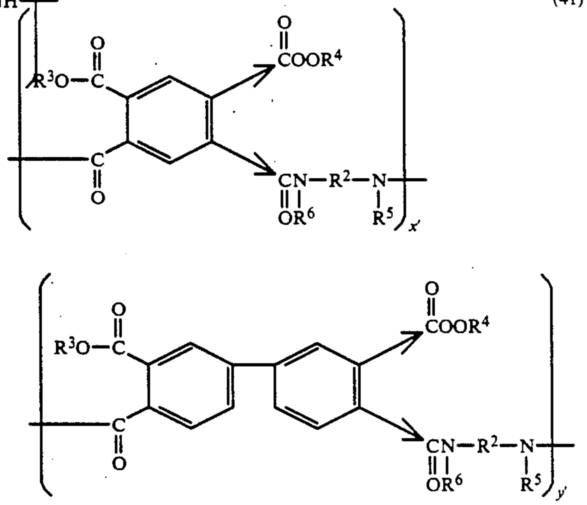

Furthermore, specific examples of the copolymer composed of the recurring units shown by formula (1), wherein $R^2$ differs in each recurring unit is as follows.

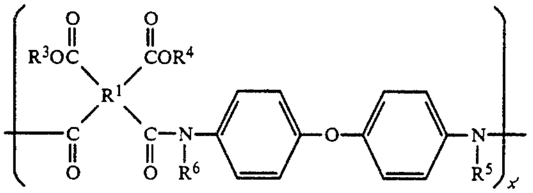

(42)

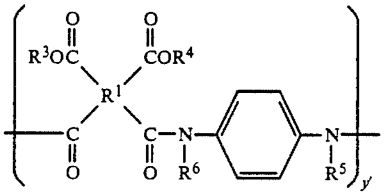

(43)

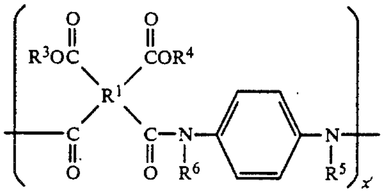

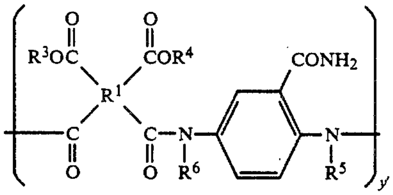

In the above formulae (41) to (43), $R^1$, $R^2$, $R^3$, $R^5$ and $R^6$ are as defined in formula (1) described above and x' and y' represent ratios as $0<x'<1$, $0<y'<1$, and $x'+y'=1$.

Also, copolymers of the recurring units shown by formula (1), wherein $R^3$, $R^4$, $R^5$, or $R^6$ differs in each recurring unit can be, as a matter of course, formed.

Such copolymers can be also formed in the formulae (2), (3) and (4). Also copolymers of the recurring unit of the above units shown by formulae (1), (2), (3), and (4) each other and also copolymers of the recurring unit of the above formula and other recuring unit than those shown by the above formula can be formed.

In addition, of the total number of the recurring units containing no hydrophobicity imparting group $R^x$ is in the range of 30% or less, the copolymer may contain such a recurring unit.

Examples of such a copolymer are as follows.

(44)

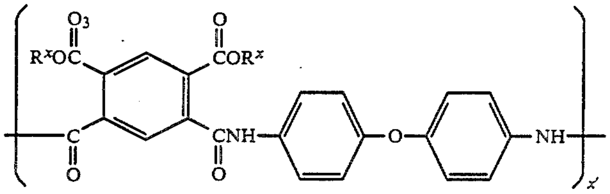

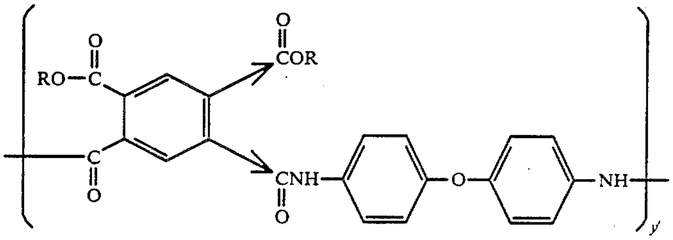

wherein, $R^x$ is the above-described hydrophobicity imparting group, R represents an alkyl group having 1 to 11 carbon atoms or a hydrogen atom, and x' and y' are ratios, as $0<y'\leqq 0.3$, $0.7\leqq x'<1$, and $x'+y'=1$.

Then, the production process for the photosensitive amphiphilic high polymer of this invention is explained.

The photosensitive amphiphilic high polymer of this invention is produced by polymerizing or copolymerizing a monomer having a 1st organic group $R^1$ and a 2nd organic group $R^2$ in any one combination of $A{-}(R_1){-}A+B{-}(R_2){-}B$, $A{-}(R^1){-}B+A{-}(R^2){-}B$, and $B{-}(R^1){-}B+A{-}(R^2){-}A$ (wherein, A represents an acid group containing a hetero atom, B represents a basic group containing a hetero atom, and when $R^1$ and $R^2$ are trivalent or tetravalent, A and/or B is bonded thereto according to the valence number thereof, for example,

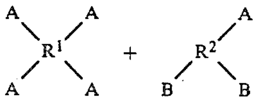

or

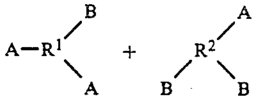

)

at least one of the two kinds of the monomers in said combination containing at least one, preferably two above-described hydrophobic imparting groups $R^x$s, using a monomer containing the above-described negative type or positive type photosensitive group in a part or the whole of the monomer containing $R^1$ and/or $R^2$.

In other process, after producing a high polymer by polymerizing or copolymerizing a monomer contianing the aforesaid 1st organic group $R^1$ and a monomer containing the 2nd organic group $R^2$ each containing neither the hydrophobicity imparting group $R^x$ nor the photosensitive group, the hydrophobicity imparting group $R^x$ and the photosensitive group can be introduced into the polymer.

However, it is not so easy to desirably introduce these groups into the high polymer by a covalent bond in chemical reaction. In addition, the process of introducing these hydrophobicity imparting group and photosensitive group as the form of salts as shown in formula (3) or (4) is a desired process.

Then, the production process of the photosensitive amphiphilic high polymer of this invention having the recurring unit shown by formula (1), (2), (3) or (4) is explained in practical.

For producing the photosensitive amphiphilic high polymer of this invention having the recurring unit shown by formula (1) described above, first, tetracarboxylic acid dianhydride shown by formula (5)

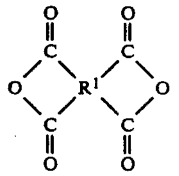
(5)

wherein, $R^1$ is same as defined above is caused to react with $R^3OH$ and $R^4OH$ (wherein, $R^3$ and $R^4$ are same as defined above) to provide a compound shown by formula (6)

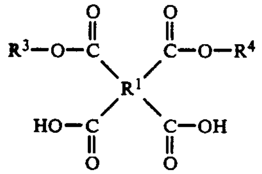
(6)

wherein, $R^1$, $R^3$, and $R^4$ are same as defined above the compound of formula (6) is caused to react with thionyl chloride, phosphorus pentachloride, benzenesulfonyl chloride, etc., in a substantially anhydrous polar organic solvent at temperature of from $-10°$ C. to 50° C., and preferably from about 0° C. to 40° C. to provide an acid halide, and further the acid halide is caused to react with a diamine shown by formula (7A)

$$R^5—NH—R^2—NH—R^6 \quad (7A)$$

wherein, $R^2$, $R^5$, and $R^6$ are same as defined above as a monomer containing the 1st organic group $R^1$. (In addition, the explanation is on the case that $R^2$ is divalent but the case that $R^2$ is trivalent or tetravalent is almost same.)

Specific examples of the compound shown by formula (5) described above are as follows.

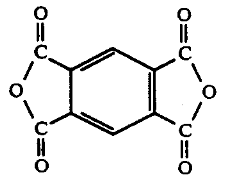

-continued

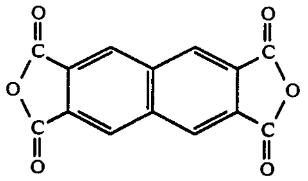

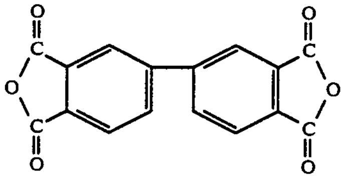

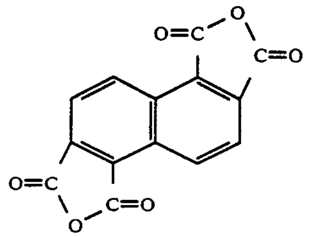

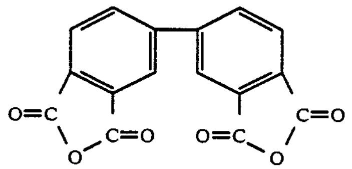

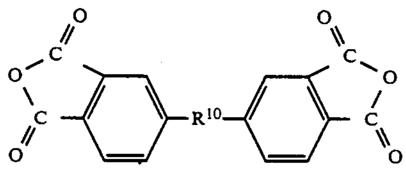

($R^{10}$ is same as above)

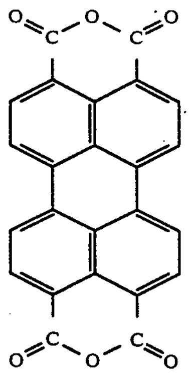

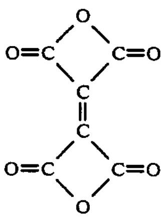

-continued

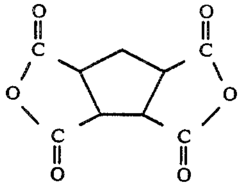

Also, specific examples of $R^3OH$ and $R^4OH$ are as follows:

$CH_3OH$, $CH_3CH_2OH$, $CH_3(CH_2)_2OH$, $CH_3(CH_2)_3OH$, $CH_3(CH_2)_5OH$, $CH_3(CH_2)_7OH$, $CH_3(CH_2)_9OH$, $CH_3(CH_2)_{11}OH$, $CH_3(CH_2)_{13}OH$, $CH_3(CH_2)_{15}OH$, $CH_3(CH_2)_{17}OH$, $CH_3(CH_2)_{19}OH$, $CH_3(CH_2)_{21}OH$, $CH_3(CH_2)_{23}OH$, $CF_3(CH_2)_{15}OH$, $H(CF_2)_2(CH_2)_{15}OH$, $H(CF_2)_4(CH_2)_{13}OH$, $F(CF_2)_8(CH_2)_2OH$, $F(CF_2)_8(CH_2)_4OH$, 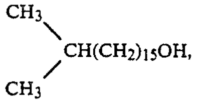

$(CH_3)_3C(CH_2)_{14}OH$, 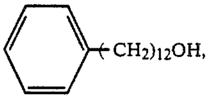

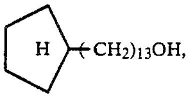 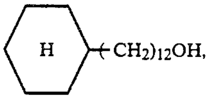 etc.,

Specific examples of $R^3OH$ and $R^4OH$ when $R^3$ and $R^4$ are the above-described negative type photosensitive group are as follows:

$CH_2=CH-CH_2OH$, $CH_2=CH(CH_2)_3OH$,

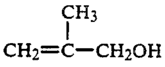

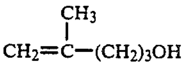

$CH_2=CH(CH_2)_{15}OH$ $CH_2=CH(CH_2)_{21}OH$ $CH_3(CH_2)_9C\equiv C-C\equiv C(CH_2)_9OH$ $CH_3(CH_2)_{11}C\equiv C-C\equiv C(CH_2)_9OH$ $CH_3(CH_2)_{13}C\equiv C-C\equiv C(CH_2)_9OH$

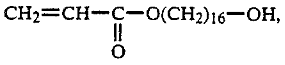

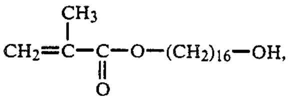

-continued

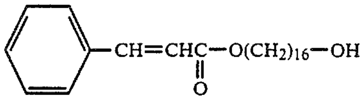

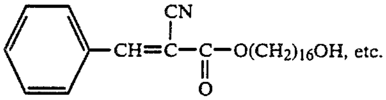, etc.

Also, specific examples of $R^3OH$ and $R^4OH$ when $R^3$ and $R^4$ are the above-described positive type photosensitive group are as follows.

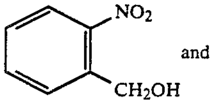 and 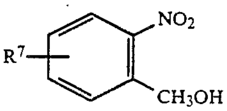

wherein, specific examples of $R^7$ are $CH_3-$, $CH_3CH_3-$, $CH_3(CH_2)_2-$, $CH_3(CH_2)_3-$, $CH_3(CH_2)_5-$, $CH_3(CH_2)_7-$, $CH_3(CH_2)_9-$, $CH_3(CH_2)_{11}-$, $CH_3(CH_2)_{13}-$, $CH_3(CH_2)_{15}-$, $CH_3(CH_2)_{17}-$, $CH_3(CH_2)_{19}-$, $CH_3(CH_2)_{21}-$, $CH_3(CH_2)_{23}-$, $CF_3(CH_2)_{15}-$, $H(CF_2)_2(CH_2)_{15}-$, $H(CF_2)_4(CH_2)_{13}-$, $F(CF_2)_8(CH_2)_2-$, $F(CF_2)_8(CH_2)_4-$,

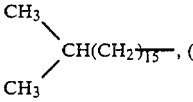, $(CH_3)_3C(CH_2)_{14}-$,

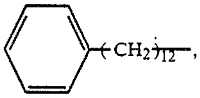, 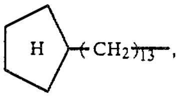,

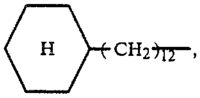, etc.

There is no particular restriction on the reaction conditions, etc., at producing the compound shown by formula (6) described above from the tetracarboxylic acid dihydride shown by formula (5) and $R^3OH$ or $R^4OH$. For example, the compound is obtained by stirring the reactants for several hours at about 100° C. under nitrogen gas stream and also a general condition that the system is stirred for about 4 days at room temperature in a solvent such as hexamethylphosphoramide can be used.

It is, however, preferred from the point of shortening the reaction time, i.e., the improvement of productivity to perform the aforesaid reaction by heating the reactants about 100° C. with stirring for 3 hours under nitrogen gas stream, dissolving the reaction product in hexamethylphorphoramide after cooling, and then forming the acid halide.

Specific examples of the polar solvent in the case of forming the acid halide are hexamethylphosphoramide, N,N-dimethylacetamide, dimethylformamide, etc., and the reaction for forming the acid halide is performed in a state that the solvent is substantially anhydrous, i. e., in the state that thionyl chloride, phosphoric pentachloride, benzenesulfonyl chloride, etc., used at the formation of the acid halide is not decomposed to provide the acid halide almost quantitatively.

If the temperature as the formation of the acid halide is lower than $-10°$ C., the reaction system becomes unpreferably heterogeneous system caused by freezing to solidification by the influence of the long chain alkyl group. However, it has been clarified that if the temperature is higher than $-10°$ C., any temperature upto about the boiling point of the acid halide can be employed without any particualr restriction. Usually, the temperature of from about 0° C. to 40° C. is preferred.

The acid halide thus produced is further caused to react with a diamine shown by formula (7A) described above to provide the amphiphilic high polymer having the recurring unit shown by formula (1) described above.

It is preferred from workability, etc., that the acid halide is used as it is after the production thereof.

Specific examples of the compound shown by formula (7A) described above are as follows.

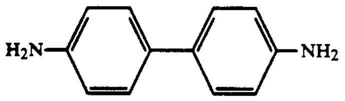

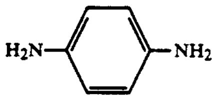

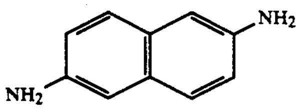

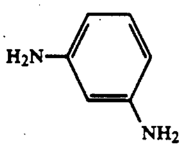

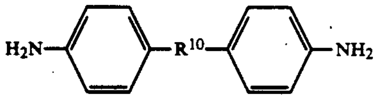

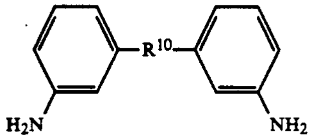

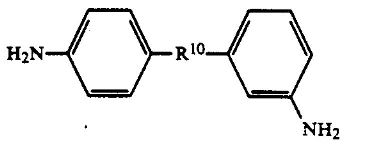

-continued

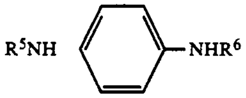

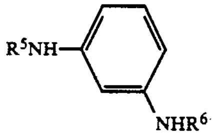

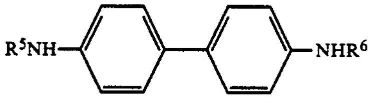

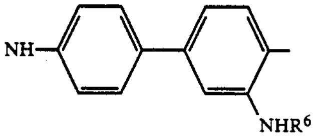

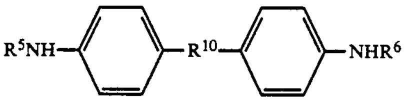

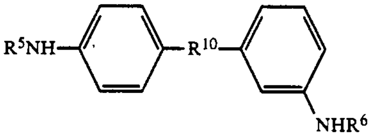

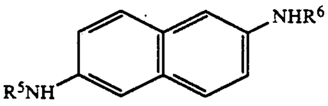

(In the above formulae, $R^{10}$ is as defined above and $R^5$ and $R^6$ are same as those described above as the specific examples of $R^7$ or further is, as the case may be, the above-described negative type photosensitive group.)

Furthermore, examples of the case that the negative type photosensitive group is directly bonded to $R^2$ are as follows.

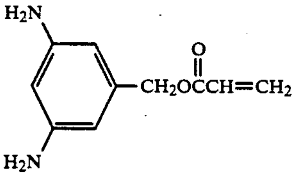

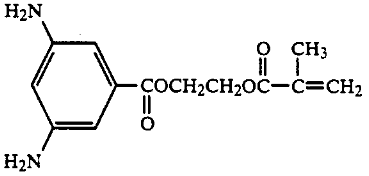

In the case of reacting the above-described acid halide and the diamine shown by formula (7A), the diamine shown by formula (7A) may be added to the acid halide or the acid halide may be added to the diamine shown by formula (7A) but since the reactants and the reaction products tend to be frozen to solidification by $R^3$, $R^4$, $R^5$, $R^6$, etc., existing in these compounds, it is general to use a solvent such as N,N-dimethylacetamide, N,N-dimethylformamide, etc. The reaction temperature is from $-10°$ C. to 20° C., and preferably from 0° C. to 10° C. If the reaction temperature is lower than $-10°$ C., the reaction system becomes heterogeneous and if the temperature is over 20° C., it is considered that undesirable reactions are liable to occur and such high temperature is undesirable. However, it has been clarified that it is preferred for performing the reaction in a homogeneous system until the completion of the reaction to perform the reaction after addition of the reactant at a temperature of higher than 20° C.

Also, as the case may be, it is sometimes preferred to use other reaction temperature than those generally explained above.

That is, when $R^5$ and $R^6$ are the aforesaid group having 12 to 20 carbon atoms, i.e., the above-described hydrophobicity imparting group $R^x$, a process of adding the acid halide to a solution of the diamine shown by formula (7A) kept at 50° C. to 60° C. is employed for reacting the diamine in a homogeneous system.

The ratio of the aforesaid acid halide and the diamine shown by formula (7A) may be properly selected for obtaining a desired molecular weight of the photosensitive amphiphilic high polymer of this invention but in the case of producing the polyamic acid for film forming, stoichiometric amounts of purified monomers and and a purified solvent are usually used for obtaining the product having high molecular weight.

However, it has been confirmed that in the case of depositing the thin films of the photosensitive amphiphilic high polymer of this invention by LB method on a substrate high molecular weight is not always necessary to obtained sufficient characteristics of the films and hence the made ratio may be deviated from the stoichiometeric ratio. For example, it has been clarified that the monomer ratio of from about 1/0.8 to 1/0.2 can be employed without giving any problems.

The case that $R^5$ and $R^6$ of the compound shown by formula (7A) are all hydrogen atoms is preferred since the reactivity thereof is good and the raw material cost is low. Also, in this case, since the carboxylic acid of the amphiphilic high polymer obtained is in an ester, the polymer is thermally stable, the product can be separated as a solid powder since the reaction does not proceed by the operation of isolation and drying, and also the product can be easily purified by the above procedure.

The polyamic acid ester of this invention having the recurring unit shown by formula (1) described above is generally produced by the process as described above but when the recurring unit of formula (1) is shown by by formula (14A), wherein $R^3$ and $R^4$ are hydrogen atom, (14A)

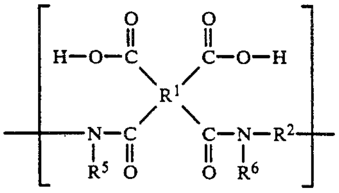

the polyamic acid ester is obtained by directly reacting the tetracarboxylic acid dihydride shown by formula (5) and the diamine shown by formula (7A) containing the above-described hydrophobicity imparting group $R^x$ and the photosensitive group without employing the process as described above.

The reaction conditions in this case are same as those in the reaction of the above-described acid halide and the diamine of formula (7), wherein $R^5$ and $R^6$ are all the hydrophobicity imparting group $R^x$.

The photosensitive amphiphilic high polymer of this invention having the recurring unit shown by formula (14A) thus obtained has the features that the polymer can be easily produced as well as a film can be formed by LB method using the polymer, and the polymer give polyimide by heating.

Then, the photosensitive amphiphilic high polymer of this invention having the recurring unit shown by formula (2) described above is obtained by using a tricarboxylic acid anhydride shown by formula (10)

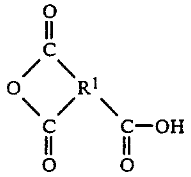

(10)

wherein, $R^1$ is same as defined above in place of the tetracarboxylic acid dianhydride shown by formula (5) in the above-described production of the polyamic acid and the ester thereof having the recurring unit shown by formula (1).

That is, by reacting $R^3OH$ (wherein, $R^3$ is same as defined above) with the tricarboxylic acid anhydride shown by formula (10), a compound of formula (11)

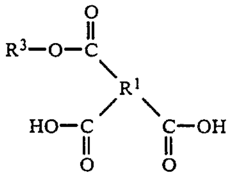

(11)

wherein, $R^3$ is same as defined above is obtained in place of the compound shown by formula (6). The compound is converted into an acid halide as in the case of the compound shown by formula (6) as described above and the acid halide is caused to react with the diamine shown by formula (7) to provide a polyamic acid ester of this invention having the recurring acid unit shown by formula (2).

Also, the polyamic acid of this invention having the recurring unit shown by formula (15A) (i.e., formula (2), wherein $R^3$ is hydrogen atom)

(15A)

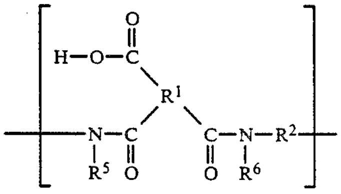

is similarly obtained by the direct reaction of the acid halide of tricarboxylic acid anhydride shown by formula (10) and the diamine shown by formula (7A), containing the above-described hydrophobicity imparting group $R^x$ and the photosensitive group. The reaction conditions for the production of the polyamic acid or the ester thereof having the recurring unit shown by formula (2) are same as the above-described case of producing the polyamic acid or the ester thereof having the recurring unit shown by formula (1).

Specific examples of the compound shown by formula (10) are as follows:

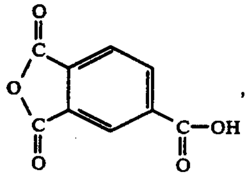
,

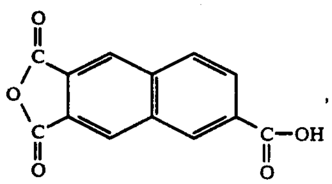
,

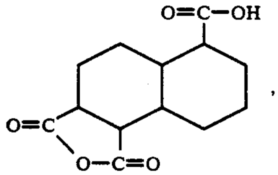
,

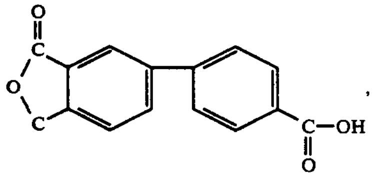
,

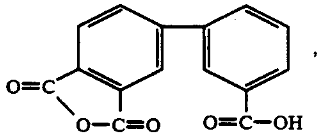
,

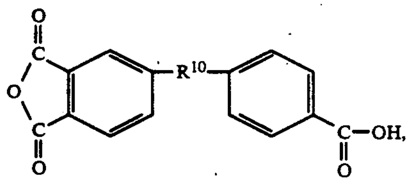
,

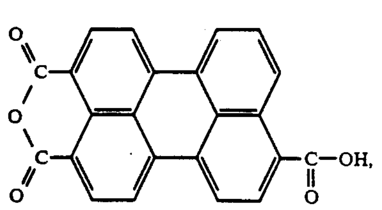
,

-continued

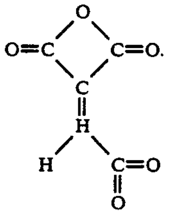
.

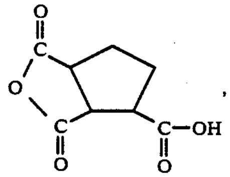
, etc.

Then, the production process for the negative type photosensitive amphiphilic high polymer of this invention, which is a polyamiic acid salt having the recurring unit shown by formula (3) described above is explained.

The polyamic acid salt of this invention having the recurring unit shown by formula (3) is obtained by reacting the polyamic acid having the recurring unit shown by formula (14A) described above and amine compounds shown by the following formulae

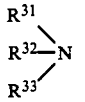 and 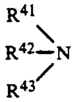

wherein, $R^{31}$, $R^{32}$, $R^{33}$, $R^{41}$, $R^{42}$, and $R^{43}$ are same as defined above.

There is no particular restriction on the manner of reacting the polyamic acid shown by formula (14A) and the amine compounds but the reaction can be performed by mixing a solution of the polyamic acid of formula (14A) dissolved in a mixture of an organic polar solvent and benzene or chloroform with a solution of the amine compounds of dissolved in a solvent having the same composition as above as desired as a developing liquid in LB method.

In this case, it is preferred that one of $R^{31}$, $R^{32}$, and $R^{33}$ and one of $R^{41}$, $R^{42}$, $R^{43}$ (e.g., $R^{31}$ and $R^{41}$) of the amine compounds shown by

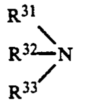 and 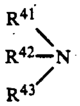

are the above-described hydrophobicity imparting group $R^x$ or the negative type photosensitive group.

In such a case, it is unnecessary to incorporate the hydrophobicity imparting group and/or the negative photosensitive group to the polyamic acid shown by formula (14A) and hence the production thereof is easy.

Specific examples of the preferred amine compounds shown by

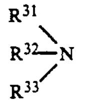 and 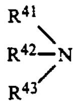

are as follows.

Examples of the amine compound having the hydrophobicity imparting group containing no photosensitive group are as follows:

$CH_3(CH_2)_{11}NH_2$, $CH_3(CH_2)_{13}NH_2$, $CH_3(CH_2)_{15}NH_2$, $CH_3(CH_2)_{17}NH_2$, $CH_3(CH_2)_{19}NH_2$, $CH_3(CH_2)_{21}NH_2$, $CH_3(CH_2)_{23}NH_2$, $CF_3(CH_2)_{15}NH_2$, $H(CF_2)_2(CH_2)_{15}NH_2$, $H(CF_2)_4(CH_2)_{13}NH_2$, $F(CF_2)_8(CH_2)_2NH_2$, $F(CF_2)_8(CH_2)_4NH_2$,

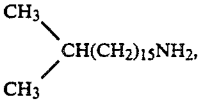, $(CH_3)_3C(CH_2)_{14}NH_2$,

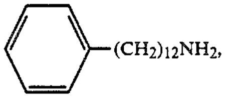, 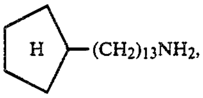,

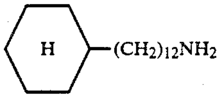

$CH_3(CH_2)_{11}NH(CH_3)$, $CH_3(CH_2)_{13}NH(CH_3)$, $CH_3(CH_2)_{15}NH(CH_3)$, $CH_3(CH_2)_{17}NH(CH_3)$, $CH_3(CH_2)_{19}NH(CH_3)$, $CH_3(CH_2)_{21}NH(CH_3)$, $CH_3(CH_2)_{23}NH(CH_3)$, $H(CF_2)_4(CH_2)_{13}NH(CH_3)$, $F(CF_2)_8(CH_2)_2NH(CH_3)$,

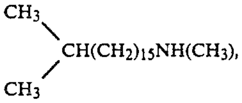, $(CH_3)_3C(CH_2)_{14}NH(CH_3)$,

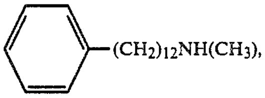,

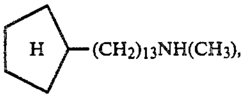,

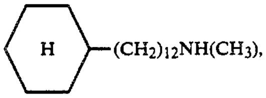, $CH_3(CH_2)_{11}N(CH_2)_2$, $CH_3(CH_2)_{13}N(CH_3)_2$, $CH_3(CH_2)_{15}N(CH_3)_2$, $CH_3(CH_2)_{17}N(CH_3)_2$, $CH_3(CH_2)_{15}N(CH_3)_2$, $CH_3(CH_2)_{21}N(CH_3)_2$, $CH_3(CH_2)_{23}N(CH_3)_2$, $H(CF_2)_4(CH_2)_{13}N(CH_3)_2$, $F(CF_2)_8(CH_2)_2N(CH_3)_2$, -continued

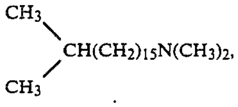, $(CH_3)_3C(CH_2)_{14}N(CH_3)_2$,

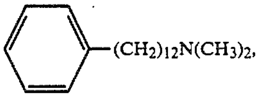,

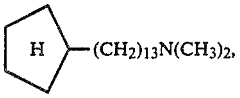,

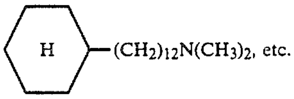, etc.

Also, examples of the amine compound having the hydrophobic negative type photosensitive group are as follows:

$CH_2{=}CH(CH_2)_{15}NH_2$, $CH_2{=}CH(CH_2)_{21}NH_2$, $CH_2{=}CH(CH_2)_{15}NH(CH_3)$, $CH_2{=}CH(CH_2)_{21}NH(CH_3)$, $CH_2{=}CH(CH_2)_{15}NH(CH_3)_2$, $CH_2{=}CH(CH_2)_{21}NH(CH_3)_2$, $CH_2{=}CHCO(CH_2)_{16}NH_2$, 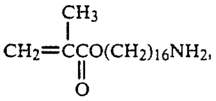,

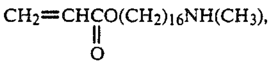, 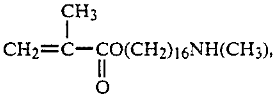,

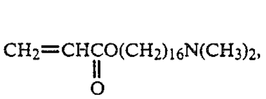, 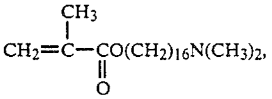,

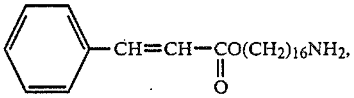,

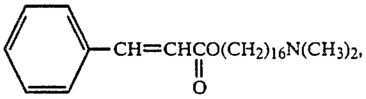,

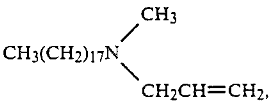, etc.

Furthermore, examples of the amine compound having the negative type photosensitive group which is not a hydrophobicity imparting group are as follows:

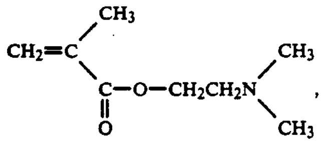

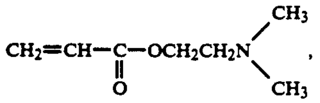

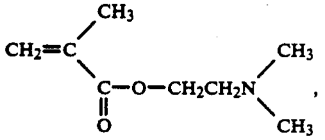

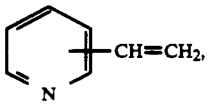

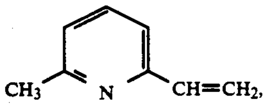

$CH_2 + CH-CH_2NH_2$,

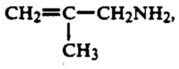

$(CH_2=CH-CH_2)_2NH$, etc.

Then, the polyamic acid salt of this invention having the recurring unit shown by formula (4) described above is obtained by using the polyamic acid shown by formula (15A) described above in place of the polyamic acid shown in formul (14A) in the above-described production for the polyamic salt having the recurring unit shown by formula (3) and reacting the polyamic acid with an amine compound shown by

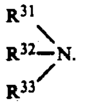

The reaction conditions, etc., are same as those of obtaining the polyamic acid salt having the recurring unit shown by formula (3).

The above explanations were all on the case that $R^2$ was divalent but the high polymers of this invention can be similarly produced in the case that $R^2$ is trivalent or tetravalent. In this case, in place of the diamine shown by formula (7A), diamines shown by following formula (7B) or (7C) is used.

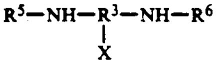 (7B)

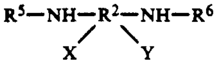 (7C)

wherein, $R^2$, $R^5$, $R^6$, X and Y are same as defined above as to formula (1).

Specific examples of the diamines shown by (7B) and (7C) are as follows:

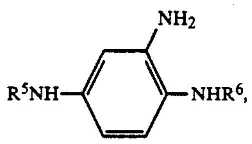

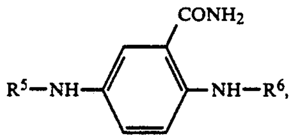

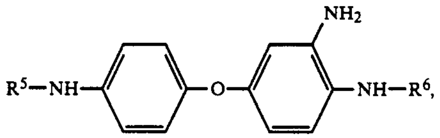

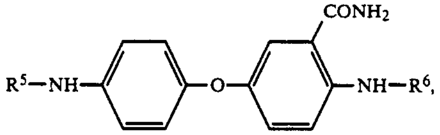

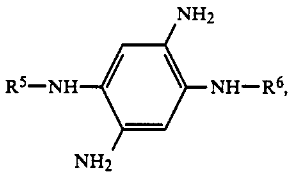

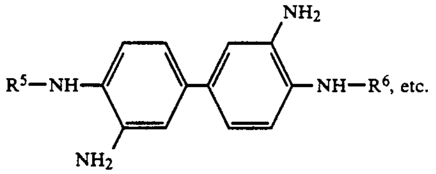

(wherein $R^5$ and $R^6$ are same as defined as to formula (1))

Now, the photosensitive high polymer of this invention thus prepared is easily soluble in an organic polar solvent such as N,N-dimethylacetamide, N,N-dimethylformamide, N,N-diethylformamide, hexamethylphosphoramide, etc., soluble in a mixed solvent of the aforesaid organic polar solvent and an ordinary organic solvent such as chloroform, etc., and sparlingly soluble or insoluble in benzene, ether, chloroform, acetone, methanol, etc.

Also, in infrared spectral analysis, there are characteristic absorptions of a divalent linkage group —AB— formed by the reaction of the aforesaid acid group A containing a hetero atom and the basic group B containing a hetero atom, the acid group A and/or the basic group B (e.g., an amide in the aforesaid polyimide precursor shown by (1A), (3A), (12A), or (14A), a carboxylic acid (carboxylic acid ester as the case may be), and long chain alkyl group.

In the case of the positive type photosensitive amphiphilic polymer having an orthonitrobenzyl group, there are also characteristic absorptions of a nitro group.

Also, in the case of the polyamic acid or the ester thereof having a precursor structure capable of becoming a 5-membered or 6-membered ring having a hetero atom as the above-described polyimide precursor, the thermal analysis result shows a feature, that is, an abrupt reduction of weight begins at about 200° C. and it is completed at about 400° C. After the completion of the reduction of weight, in the case of, for example, the polyimide precursor, the absorptions of amide, carboxylic acid ester, nitro group, and long chain alkyl vanish and the absorption of imide ring appear, which shows thermally proceeding of ring closing reaction.

On the other hand, in the case that the precursor is a polyamic acid salt, the ring closing reaction does not generally proceed thermally, but the ring closing reaction is completed by immersing in a ring closing reagent such as glacial acetic acid, pyridine, etc. After the completion of the ring closing reaction, in the case of, for example, the polyimide precursor, the absorptions of amide, carboxylate, and long chain alkyl group vanish and the absorption of imide ring appears.

Then, the production of LB film using the high polymer of this invention is explained.

As a method for forming LB film, there is a vertical dipping method wherein a film forming material is spread in the surface of water, the material spread on the surface of water is compressed at a constant surface pressure to form a monomolecular film, and the film is transferred onto a substrate by moving the substrate upward and downward through the film. Also, there are the horizontal dipping method, the revolving cylindrical method, etc., *Shin Jikken Kagaku Koza* (*New Experimental Chemistry Course*), Vol. 18, "Kaimen to Colloid (Intercirface and Colloid)", pages 498–508). That is, any method ordinarily performed can be used without any restriction.

The LB method is a method capable of forming oriented film and controlling the thickness with an accuracy of some tens Å, that is, an excellent method of forming a thin film of less than 2000 Å, or further less than 1000 Å as well as several hundreds Å or several tens Å. However, a film having a thickness of 10,000 Å or more can be formed by the method.

In the case of spreading a LB film forming material on the surface of water, a solvent which is not dissolved in water and evaporates into gaseous phase, such as benzene, chloroform, etc., is generally used but in the case of the photosensitive amphiphilic high polymer of this invention, it is preferred to use the solvent together with an organic polar solvent for increasing the solubility. Examples of such an organic polar solvent are N,N-dimethylformamide, N,N-dimethylacetamide, N,N-diethylformamide, N,N-diethylacetamide, N,N-dimethylmethoxyacetamide, dimethylsulfoxide, N-methyl-2-pyrrolidone, pyridine, dimethylsulfone, hexamethylphosphoramide, tetramethylsulfone, dimethyltetramethylenesulfone, etc.

In the case of using the organic polar solvent with benzene, chloroform, etc., it is considered that when the high polymer is spread on the surface of water using the mixed solvent, benzene, chloroform, etc., evaporates into gaseous phase and the organic polar solvent dissolves in a large amount of water.

There is no particular restriction on the concentration of the solution used for spreading the precursor of this invention on the surface of water but the concentration is usually from $2\times10^{-3}$M to $5\times10^{-3}$M. For obtaining good film-forming property, the addition of metal ions and the pH control are not always necessary, and the exclusion of metal ions is considered to be advantageous in the case of using the films in the field of electronics.

There is no particular restriction on the substrate for forming thereon LB film using the photosensitive amphiphilic high polymer of this invention and the material may be properly selected according to uses of the LB film formed. In the case of using LB film by cyclizing the LB film into a film of polyimide, etc. by heating or chemical curing, the substrate is required have good heat resistance and chemical resistance.

Specific examples of the substrate are inorganic substrate such as glass, alumina, quartz, etc., metallic or plastic base plates, substrate of semiconductors of groups IV, III-V, II-VI, etc., such as Si, GaAs, ZnS, etc., substrate of ferroelectric materials such as $PbTiO_3$, $BaTiO_3$, $LiNbO_3$, $LiTaO_3$, etc., and those made of magnetic materials. As a matter of course, a thin metal film formed on a substrate as described above may be patterned suitable for application and also semiconductors or ferroelectric substrate, such as Si, GaAs, ZnS, etc., may be previously processed to form an element. Also, as a matter of course, the substrate may be subjected to a surface treatment as usually applied before use.

The photosensitive amphiphilic high polymer of this invention has generally a tendency of showing weak adhesion strength for the surface of glass, quarts, Si, $SiO_2$, etc. Thus, by treating the surface of such a substrate with a silane coupling agent, in particular a silane coupling agent having an epoxy group and an alkoxy group (e.g., A-1100, A-187, etc., trade name, made by Union Carbide Corporation) or treating the surface thereof with a chelating agent containing aluminum to form an aluminum oxide layer thereof, the film-forming property and the adhesive strength are improved, which is a preferred embodiment of this invention. As a matter of course, the substrate may be treated in several layers with a metal salt of a fatty acid.

Also, when a mixture of the photosensitive amphiphilic high polymer of this invention and a known film-forming compound is used in the case of depositing the high polymer of this invention on a base plate, the film-forming property is improved, which is a preferred embodiment of this invention.

The aforesaid known LB film-forming compounds are compounds described in the literature cited hereinbefore and known in the field of art. The compounds composed of a hydrocarbon group having from about 16 to 22 carbon atoms and a hydrophilic group shown by the following formulae are particularly preferred:

$CH_2(CH_2)_{n-1}Z$, $CH_2{=}CH(CH_2)_{n-1}Z$, $CH{\equiv}C{-}(CH_2)_{n-2}Z$, $CH_3(CH_2)_lC{\equiv}C{-}C{\equiv}C(CH_2)_mZ$,

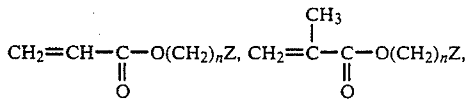

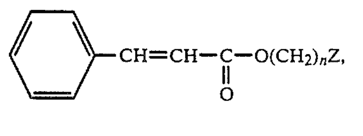

-continued

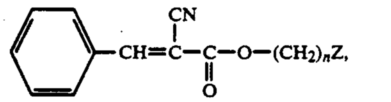

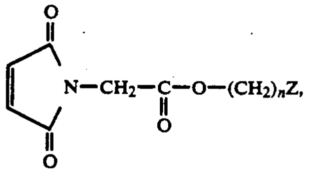

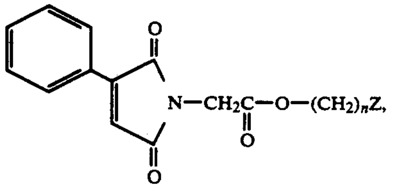

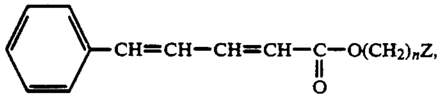

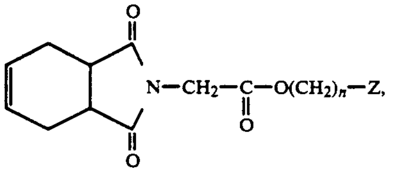

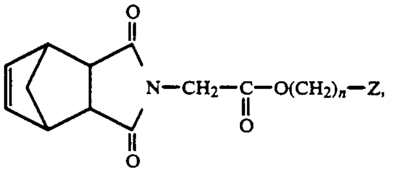

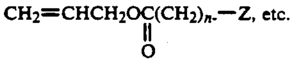

In the above formulae, n represents 16 to 22, $l+m=n-5$, and Z represents OH, $NH_2$, NHR', NR'R', COOH, $CONH_2$, CONHR', CONR'R', or COOR' (wherein, R' represents a lower aliphatic hydrocarbon group).

The compound shown by the formula $CH_3(CH_2)_{n-1}Z$ is excellent in the point of cost but the aforesaid compound having an unsaturated bond can be polymerized by the irradiation of light and radiations and is preferred for improving the film-forming property.

There is no particuar restriction on the mixing ratio of the aforesaid compound described above and the high polymer of this invention. Also, two or more compounds selected from the above-described polyimide precursors and/or copolymers can be used for film-forming.

Also, in this invention, it is preferred to use a sensitizer as described below and the long chain hydrocarbon-substututed product thereof.

Examples of the preferred sensitizer are anthraquinone, benzoquinone, naphthoquinone, benzoanthraquinone, benzophenone, etc., which are known as sensitizers in the field of art and long chain hydrocarbon-substituted products of such sensitizers so modfifed as suitable for LB film.

By using the photosensitive amphiphilic high polymer of this invention, LB film having less defects can be formed on a substrate by LB method and the LB film can be patterned by an ordinary fine patterning technique. That is, a relief pattern can be obtained by irradiating the LB film with ultraviolet rays, visible rays, electron beams, X-rays, etc., through a photomask and dissolving of the unexposed portions in the case of negative type photosensitive polymer or the exposed portions in the case of positive type photosensitive polymer with a developer.

When the positive type photosensitive amphiphilic high polymer of this invention having an orthonitrobenzyl group as explained practically hereinbefore is irradiation by light such as ultraviolet rays, etc., electron beams, X-rays, etc., the orthonitrobenzyl ester is decomposed to form a polyamic acid For example;

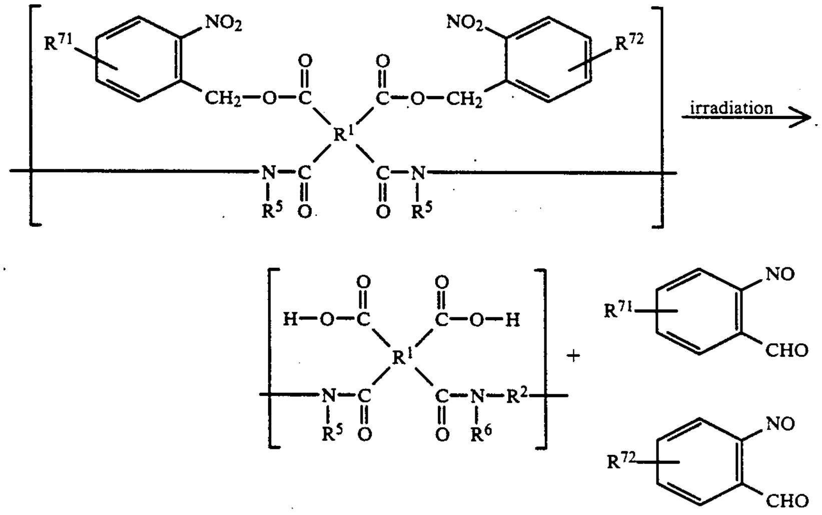

Since the polyamic acid formed by the decomposition of the precursor of this invention by the irradiation of ultraviolet rays, etc., is soluble in an aqueous alkali solution, a solution mainly composed of an aqueous alkali solution can be used as the developer in the case of pattern formation.

In the case of negative type photosensitive high polymer, the developer may be a solvent for the negative type photosensitive high polymer but a mixed solvent of N,N-dimethylacetamide, N,N-dimethylformamide, N,N-diethylformamide, hexamethylphosphoramide, N-methyl 2-pyrrolidone, etc., and benzene, ether, chloroform, acetone, etc., is preferably used.

A solution for washing a relief pattern formed by development and removing a developing solvent is preferably a liquid compatible with a developing solution such as water, methanol, ethanol, isopropanol, benzene, toluene, xylene and the like.

Such a patterned thin film of the high polymer may be used as it is but by partially or completely converting the polymer of the thin film into imide or partially or completely ring-closing the polymer of the thin film, the thin layer is provided with an imide ring or other ring structure having high heat resistance.

There is no particular restriction on the method of converting the polymer into imide or ring closing the polymer but in the case of the polyamic acid or the ester thereof, heating to a temperature of from about 300° C. to 400° C. is general and laser beam may be used. For example, in the case of the polymer having the recurring unit shown by formula (1A), the reaction occurs as follows.

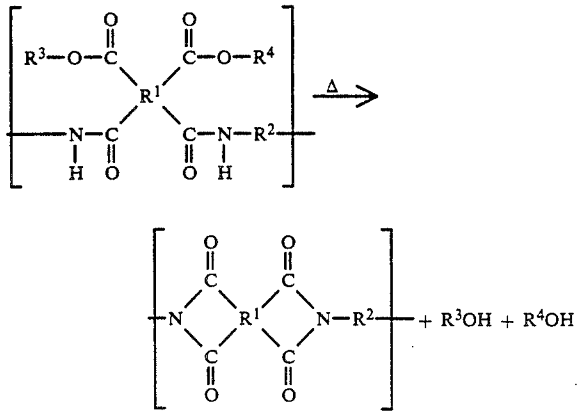

Also, in the case of the polymer having the recuring unit shown by formula (14A), the reaction occurs as follows;

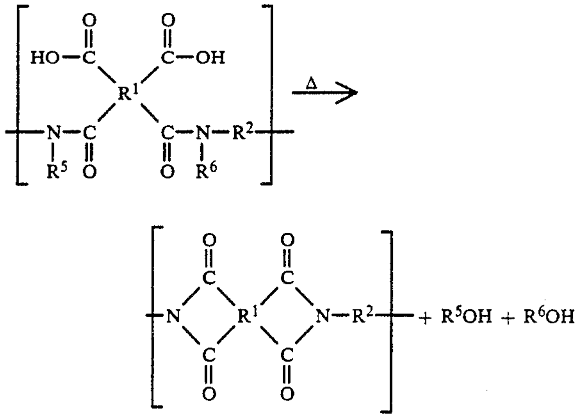

Furthermore, in the case of the polymer having the recuring unit shown by formula (12A), the reaction occurs as follows to form a polyimide compound;

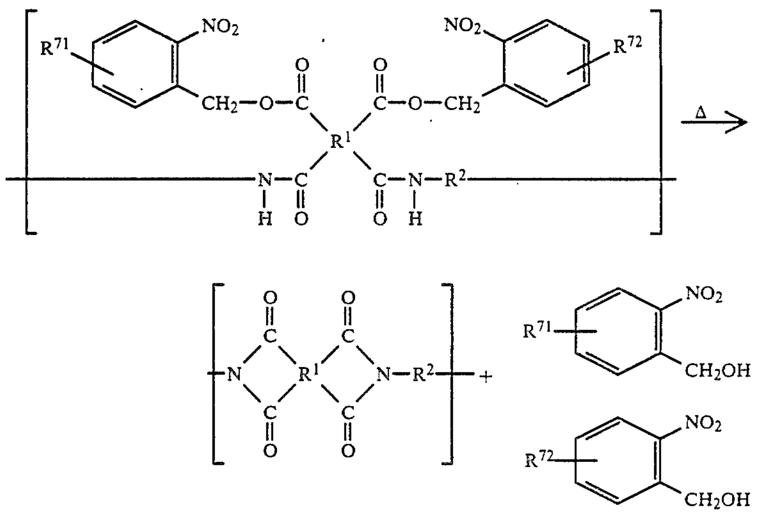

Furthermore, when the photosensitive amphiphilic high polymer of this invention is a polyamic acid salt having the recurring unit shown by formula (3) or (4), it is preferred the treatment of the thin layer is performed by a chemical curing agent, which is used at curing polyamic acid, such as acetic anhydride, pyridine, etc. In this case, for example, in the case of the polymer having the recuring unit shown by formula (3A), the reaction occurs as follows to form also an imide compound;

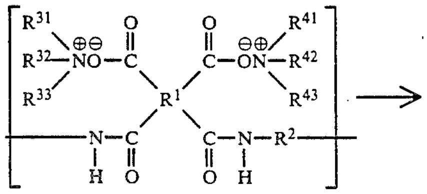

-continued

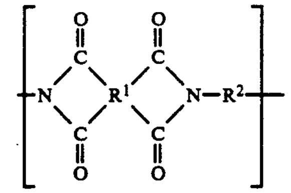

Also, since the LB film formed by the photosensitive amphiphilic high molecular having the precursor structure of this invention has improved heat resistance and chemical resistance as compared to conventional LB film, the LB film of this invention can be used as it is for various devices without applying imide-formation or ring closing.

As described above, the thin film of polyamide, etc. obtained is excellent in heat resistance, chemical resistance, and mechanical properties as well as and very thin as less than 10,000 Å or, if desired, as 10 to 1,000 Å. Accordingly, the LB film of this convention can be used in electronic field as an insulting film for IC, LSI, etc., as well as an insulating layer for various electric and electronic elements such as capacitors, MIS, MIM, etc., and further can be used for electric field effect transistors, photoelectric convertors, light-receiving elements, light emitting elements, light-detecting elements, hot electron transistors, etc. Moreover, the LB film can be utilized as clad material for wave guides, optical circuit components, etc., and also suitably used as coating materials including for protection. Also, the LB film can be used in the field of energy conversion or material separation.

When the particularly important patterned thin film of the photosensitive amphiphilic high polymer of this invention and said photosensitive high polymer has the precursor structure capable of causing ring-closing reaction, the heat-resisting high polymer thin film formed by ring-closing the thin film of the photosensitive high polymer can be used as resist capable of being dry etched for very fine patterning such as submicron by utilizing the features of being very thin film and high heat resistance and chemical resistance.

Then, the production process for the precursors of this invention is explained based on the following examples.

EXAMPLE 1

Synthesis of 3,5-diaminobenzoic acid ethylmethacrylic acid ester

In 200 ml of tetrahydrofuran were dissolved 29.6 g of 2-hydroxyethyl methacrylate and 18.1 g of pyridine and a tetrahydrofuran solution of 50 g of 3,5-dinitrobenzoic acid chloride was slowly added dropwise to the solution at about 5° C. followed by continuing the reaction for one hour at 10° C. After removing pyridine hydrochloride deposited, the residue was poured in water to form precipitates, which were recovered, washed, and dried to provide 58 g of 3,5-dinitrobenzoic acid ethylmethacrylic acid ester.

After dissolving 25 g of the 3,5-dinitrobenzoic acid ethylmethacrylic acid ester in 200 ml of acetic acid, the solution was added little by little to a suspension of 135 g of an iron powder in a mixture of 75 ml of water and 175 ml of acetic acid at 25° C. and thereafter, the mixture was stirred for 15 minutes. After removing the iron powder, the reaction mixture was cooled to 0° C. and after adjusting the pH thereof to 8 with aqueous ammonia, the product was extracted with ethyl acetate. Then, ethyl acetate was distilled off from the extract and the crude product obtained was purified by a silica gel column to provide 9 g of 3,5-diaminobenzoic acid ethylmethacrylic acid ester (m.p. 88° to 89° C., identified by IR and proton NMR).

Synthesis of pyromellitic acid distearyl ester

After reacting 10.91 g of pyromellic acid dianhydride and 27.05 g of stearyl alcohol for 3 hours at 120° C., the product obtained was recrystallized from 200 ml of ethanol to provide pyromellitic acid distearyl ester having melting point of 133° to 137° C. The product was identified by IR and proton NMR.

Synthesis of photosensitive polyimide precursor using 3,5-diaminobenzoic acid ethylmethacrylic acid ester In 6 ml of hexamethylphosphoramide was dissolved 3.79 g of pyromellitic acid distearyl ester and after cooling to 5° C., 1.19 g of thionyl chloride was added dropwise to the solution and thereafter, the mixture was kept for one hour to finish the reaction. Thereafter, 1.32 g of 3,5-diaminobenzoic acid ethylmethacrylic acid ester dissolved in 30 ml of dimethylacetamide was added dropwise to the reaction mixture at about 10° C. and after causing reaction for 2 hours while increasing the reaction temperature to about 20° C., the reaction mixture was poured in 400 ml of ethanol to deposit the reaction product. The deposits were recovered by filtration and dried under reduced pressure at 30° C. to provide about 4 g of a light yellow powder. The product was identified by IR spectra and proton-NMR.

EXAMPLE 2

The product obtained in Example 1 was dissolved in a mixed solvent of distilled chloroform and dimethyl acetamide (8:2) to provide a spreading solution for LB film. The solving was spread on the surface of re-distilled water and when the relation between the surface pressure and the area per recuring unit was measured at 20° C., the film showed the formation of good condensation phase and the limiting area was about 55 Å/unit.

The deposition of the film on an A1 evaporated glass substrate Y-type and good deposited films were obtained. By irradiating the deposited film of 199 layers through a mask with ultraviolet rays using a very high pressure mercury lamp, the film was light-cured. After light-cured, the film was developed with a mixture of ethanol and dimethylacetamide (1:1) to form a relief pattern. Thereafter, when the patterned film was heat-treated for 1 hour at 400° C. under nitrogen gas stream, it was confirmed by FT-TR-ATR spectra that the imide formation proceeded in the patterned film.

EXAMPLE 3

Synthesis of pyromellitic acid di-o-nitrobenzyl ester

After reacting 10.91 g of pyromellitic aid dianhydride and 15.3 g of o-nitrobenzyl alcohol for 3 hours at 120° C., the product thus obtained was recrystallized to provide pyromellitic acid di-o-nitrobenzyl ester. The structure thereof was determined by IR, $^1$HNMR, and elemental analysis.

Synthesis of N,N'-distearyl-p-phenylenediamine

A mixture of 15.6 g of p-phenylenediamine, 15.5 g of stearyl bromide, and 1.96 g of powdered sodium hydroxide was heated to 140° to 150° C. for about 3.5 hours with stirring under nitrogen gas stream. After the reaction was over, 50 ml of water was poured to the reaction mixture and black-purple solids thus formed were recovered by filtration. When the solids were washed with water, ethanol, and methylene chloride and filtered to provide about 5.8 g of a pink powder of N,N'-distearyl-p-phenylenediamine. The structure was confirmed by $^1$HNMR, IR spectra, and elemental analysis.

Synthesis of precursor from pyromellitic acid di-o-nitrobenzylester and N,N'-distearyl-p-phenylenediamine In 50 ml of hexamethylphosphoramide was dissolved 1.57 g of pyromellitic acid di-o-nitrobenzyl ester and after adding dropwise 0.714 g of thionyl chloride to the solution, the mixture was stirred for one hour. The solution was added dropwise to a solution of 1.85 g of N,N'-distearyl-p-phenylenediamine in 80 ml of hexamethylphopshoramide at about 50° to 60° C. with stirring. After stirring the mixture for one hour at the same temperature, the reaction mixture was poured in 600 ml of re-distilled water and the resultant mixture was allowed to stand for one hour. The precipitates thus deposited were recovered by filtration and washed to provide 3.9 g of a precursor as a gray-green powder.

The powder obtained was identified by IR spectral analysis, $^1$HNMR analysis, thermal analysis, and molecular measurement by GPC.

EXAMPLE 4

The film-forming characteristics of the precursor obtained in Example 3 as LB film were evaluated.

When the surface pressure-area curve on the surface of re-distilled water was measured at 20° C., the surface pressure abruptly raised at about 65 Å/unit and good condensed film was formed. The limiting area was 60 Å$^2$/unit and the collaps pressure was about 50 dyn/cm.

Then, the film on re-distilled water was deposited on an Al evaporated glass substrate by LB method at a surface pressure of 25 dynes/cm and accumulation speed of 10 mm/min to provide a Y-type film. The deposited precursor film of 201 layers was irradiated with ultraviolet rays through a mask using a high pressure mercury lamp. Thereafter, the film was developed with an aqueous 2% KOH solution to form a pattern. By heating the pattern to 400° C. for one hour inder nitrogen gas stream, it was clarified that the precursor was converted into imide and the pattern of the polyimide was formed.

EXAMPLE 5

Synthesis of photosensitive polyamic acid salt

A photosensitive polyamic acid salt was produced using the 3.5-diaminobenzoic acid ethyl methacrylic acid ester synthesized in Example 1.

In 50 ml of dry dimethylacetamide was dissolved 2.18 g (0.01 mol) of pyromellitic acid dianhydride in a flask, and a solution of 2.64 g (0.01 mol) of 3,5-diaminobenzoic acid ethyl methacrylic acid ester dissolved in 30 ml of dimethylacetamide was added dropwise to the aforesaid solution at about 10° C. over a period of about 10 minutes under dry nitrogen gas stream followed by causing reaction for 2 hours.

The reaction mixture was diluted with diemthylacetamide and benzene (1:1) to provide a solution of $1\times10^{-3}$M and the solution was mixed with a solution of $2\times10^{-3}$M of N-n-octadecyldimethylamine in dimethylacetamide and benzene (1:1) to provide a solution of a photosensitive polyamic acid salt as a spreading liquid for LB film.

EXAMPLE 6

When, the surface-area curve of the salt obtained in Example 5 on the surface of re-distilled water at 20° C., the surface pressure began to raise at about 150 Å$^2$ of area per recurring unit (unit) and a condensed film was formed. The limiting area was about 140 Å$^2$.

When the film on the surface of water was deposited on a aluminum-vapor deposited galss substrate by LB method, Z type accumulation was obtained. In the FTIR-ATR analysis of the deposited film, the characteristic absorptions of alkyl group of 3000 to 2800 cm$^{-1}$ and the salt of 1650–1600 cm$^{-1}$ were observed.

When the deposited film was chemically cured with pyridine and acetic anhydride, the absorptions of the alkyl group and the salt were vanished and the absorptions of an imide bond of 1780 and 1720 cm$^{-1}$ appeared, which clearly showed occuring of imide-forming reaction in the deposited film.

Also, the deposited film of 200 layers was light-cured by the irradiation of ultraviolt rays through a mask using a very high pressure mercury lamp. Thus, a relief pattern was formed. Thereafter, by chemically curing the pattern with pyridine and acetic anhydride, it was confirmed that the imide-formation proceeded in the pattern film by FTIR-ATR spectra.

EXAMPLE 7

Synthesis of pyromellitic acid bis-ω-heptadecenyl ester

In a 200 ml four-neck flask were placed 1.29 g (5.91 mmol) of pyromellitic acid dianhydride and 3.00 g (11.8 mmol) of ω-heptadecenyl alcohol (made by Dojin Kagaku K.K.) and they were stirred by a mechanical stirrer while heating to 150° C. for 2.5 hours under nitrogen gas stream. The white solids obtained were recrystallized from ethanol to provide 4 g of white solids. The structure was identified by NMR and IR spectra.

Synthesis of photosensitive polyimide precursor using pyromellitic acid bis ω-heptadecenyl ester In a 200 ml four-neck flask equipped with a mechanical stirrer and a thermometer was placed 1.54 g (2.12 mmol) of pyromellitic acid bis ω-heptadecenyl ester and the ester was dissolved in 20 ml of hexamethylphosphoramide. Then, 0.505 g (4.24 mmol) of thionyl chloride was added dropwise to the solution and the mixture was stirred for one hour at room temperature to form a light yellow solution. The solution was cooled to about 5° C. with a ice bath, 30 ml of a dimethylacetamide solution of 0.424 g (2.12 mmol) of diaminodiphenyl ether was added dropwise to the solution over a period of about 15 minutes, and the reaction was continued for one hour at 5° C. and then for 1.5 hours while raising temperature. The reaction mixture was poured in ethanol to deposit a polymer, which was recovered by filtration and dried under reduced pressure to provide 0.6 g of a light yellow powder. The structure was determined by NMR and IR spectra.

EXAMPLE 8

The film-forming characteristics of the precursor obtained in Example 7 as LB film were evaluated.

When the surface pressure-area curve on the surface of re-distilled water was measured at 20° C., the surface pressure raised slowly at about 75 Å$^2$/unit and a condensed film was formed. The limiting area was 64 Å/unit and the collaps pressure was about 30 dynes/cm.

Then, the film on the surface of re-distilled water was deposited on an aluminum vapor-deposited glass base plate by LB method at 20° C. and at a surface pressure of 20 dynes/cm and accumulation speed of 10 mm/min, a Y-type film was obtained but the film-forming property was unstable to some extent.

However, when an equimolar amount of steary alcohol was added, the slope of the surface pressure-area curve became sharp and the collaps pressure was raised.

The mixed film could be deposited as a Y-type film of deposition ratio of 1. Furthermore, in the mixed film, even by adding Michler's ketone at a ratio of precursor:-stearyl alcohol:Michler's ketone at 1:1:0.33, the film could be deposited as Y film.

By irradiating the mixed deposited film of 21 layers added Michler's ketone with ultraviolet rays through a mask using a very high pressure mercury lamp and then developing a mixed solvent of ethanol and dimethylacetamide (1:1), a negative type pattern was obtained.

Furthermore, when the pattern film was heated to 400° C. for one hour under nitrogen gas stream, it was clarified that the precursor remaining as the pattern became imide to form a pattern of polyimide.

EXAMPLE 9

Synthesis of 1,16-hexadecanediol monoacryl ester

In a 200 ml four-neck flask equipped with a mechanical stirrer were placed 4.70 g (18.2 mmol) of 1,16-hexadecanediol (made by Aldrich), triethylamine, and tetrahydrofuran and they were stirred under nitrogen gas to form a uniform solution. When 15 ml of a tetrahydrofuran solution of 1.66 g (18.2 mmol) of acrylic acid chloride (made by Wako) was added dropwise to the solution at room temperature over a period of 15 minutes, white precipitates immediately formed. After further stirring the mixture for 2 hours at room tempeerature, white precipitates were filtered away, the filtrate was concentrated, and remaining white solids were washed with 100 to 150 ml of $CH_2Cl_2$ to separate therefrom crude products.

By purifying the product with silica gel column, the desired product was obtained. The product was identified by $^1$HNMR and IR spectra.

Synthesis of pyromellitic acid bis(acryloyloxyhexanodecyl) ester

To 20 ml of hexamethylphosphoramide solution of 0.654 g (3.00 mmol) of pyromellitic acid dianhydride (the solution became green) was added dropwise 15 ml of hexamethylphosphoramide solution of 1.8 g (6.00 mmol) of the monoester synthesized in the above step with stirring at 0° C. in a nitrogen gas atmosphere (the solution became light ashy) and then the mixture was allowed to stand for more than 3 days at room temperature to provide a colorless solution. A small amount of the solution thus formed was poured in water to form white precipitates. By $^1$HNMR and IR spectra of the white solid obtained, it was confirmed that the desired half ester formed.

Synthesis of photosensitive polyimide precursor using pyromellitic acid bis(acryloyloxyhexadecyl)ester While keeping the above-described solution of pyrromellitic acid bis(acryloyloxyhexadecyl)ester at about 0° C. by an ice bath, 0.714 g (6.00 mmol) of thionyl chloride was added to the solution and the mixture was stirred for 2 hours at the same temperature. To the mixture was added dropwise 20 ml of a dimethylacetamide solution of 0.600 g (3.00 mmol) of diaminodiphenyl ether over a period of about 15 minutes, and after stirring the mixture for one hour at 5° C. and then for one hour at room temperature, the reaction mixture obtained was poured in a mixed solution of water and ethanol to deposit a polymer, which was recovered by filtration and dried under reduced pressure to provide 1.22 g (yield 40.4%) of a light yellow powder.

The structure was identified by $^1$HNMR and IR spectra.

EXAMPLE 10

The film-forming characteristics of the precursor obtained as LB film were evaluated.

When the surface pressure-area curve on the surface of re-distilled water was measured at 20° C., the surface pressure slowly raised at about 160 Å$^2$/unit and a condened film was formed. The limiting area was 58 Å$^2$/unit and the collapse pressure was about 43 dynes/cm.

Then, the film on the surface of re-distilled water was deposited onto an aluminum vapor-deposited base plate by LB method at 20° C. and at a surface pressure of 20 dynes/cm and accumualtion speed of 10 mm/min, a Y-type film was obtained but the film-forming property was unstable to some extent.

However, when an equimolar amount of stearyl alcohol was added, the slope of the surface pressure-area curve became sharp and the collaps pressure was raised.

The mixed film could be deposited as Y film of deposition ratio of 1. Furthermore, even when Michler's ketone was added at a ratio of polymer:stearyl alcohol:-Michler's ketone of 1:1:0.33, the mixed film could be accumulate as Y film.

By irradiating the mixed accumualted film of 21 layers added with Michler's ketone through a mask with ultraviolet rays using a very high mercury lamp and developing a mixed solvent of ethanol and dimethylacetamide (1:1), a negative type pattern was obtained.

Furthermore, by heating the pattern to 400° C. for one hour under nitrogen gas stream, it was clarified that the precursor remianed as the pattern was converted to a imide and a pattern of polyimide was formed.

EXAMPLE 11

By following the same procedure as Example 7 using 2,5-diaminobenzamide in place of diaminodiphenyl, a photosensitive polyimide precursor was synthesized.

Furthermore, the film-forming photosensitive characteristics were evaluated by the same manner as in Example 8. By the addition of stearyl alcohol, the stability of the film was increased and could be deposited as Y film. Also, by irradiating the mixed deposited film of the precursor, stearyl alcohol, and Michler's ketone through a mask with light of a very high pressure mercury lamp, a negative pattern could be formed.

Furthremore, by heating the pattern to 400° C. for 2 hours under nitrogen gas stream, it was clarified that the precursor remained as the pattern caused ring-closing to form a pattern of polyimide isoindroquinazolindione.

EXAMPLE 12

By following the same procedure as Example 7 using trimellitic acid anhydride in place of pyromellitic acid dianhydride, trimellitic acid ω-heptadecenyl ester was synthesized. Furthermore, by reacting the product with diaminodiphenyl ether, a photosensitive polyamidoimide precursor was synthesized.

By applying light of a very high mrecury lamp onto the mixed deposited film of the precursor, stearyl alcohol, and Michler's ketone, a negative type pattern could be formed and by heating the pattern, it was clarified that a pattern of polyamido-imide was formed.

EXAMPLE 13

A solution of 0.545 g (2.50 mmol) of pyromellitic acid dianhydride dissolved in 25 ml of dimethylacetamide was added dropwise to a solution of 1.53 g (2.50 mmol) of N,N'-distearyl-p-phenylenediamine dissolved in 30 ml of hexamethylphosphoramide at about 40° to 50° C. and then the reaction was performed for one hour.

The reaction mixture obtained was diluted with dimethylacetamide and benzene (1:1) to form a solution of $1\times10^{-3}$M and the solution was mixed worth a solution of $2\times10^{-3}$M of diethylaminoethyl methacrylate to provide a solution of photosensitive polyamic acid salt as a spreading solution for LB film.

EXAMPLE 14

Using the spreading solution obtained in Example 13, a surface pressure-area curve of the film on the surface of re-distilled water was measured at 20° C., which showed the formation of a stable condensed film.

The mixed film with Michler's ketone could be deposited on an aluminum vapor-deposited galss base plate by LB method and by the application of light of a very high pressure mercury lamp, a negative type pattern could be formed. Also, by heating, a pattern of poluimide could be formed.

According to this invention, a film can be formed by LB method and also the photosensitive amphiphilic high polymer modified so that the polymer can be dimeried or polymerized, or decomposed by the irradiation of light such as ultraviolet rays, etc., electron beams, X-rays, etc., forms a stable film on the surface of water and the film can be well accumulated on a substrate. By forming a relief pattern by light curing or light decomposing the accumulated film and then, if desired, partially or completely converting the film into imide or cyclizing the film, a patterned very thin film of less than 10,000 Å, if desired, 10 Å to 1,000 Å in thickness and having very good heat resistance and good chemical resistance and mechanical properties can be obtained.

While the invention has been described in detail and with reference to specific embodiment thereof, if will be apparent to one skilled in the art that various changes and modifications can be made therein without departing from the spirit and scope thereof.

What is claimed is:

1. A photosensitive amphiphilic high polymer comprising a linear recurring unit containing at least a divalent first organic group $R^1$ having at least two carbon atoms and at least a divalent second organic group $R^2$ having at least two carbon atoms, said organic groups $R^1$ and $R^2$ being connected to each other by a divalent linkage group formed by a reaction of an acid group A containing a hetero atom and a basic group B containing a hetero atom; at least one hydrocarbon-containing group having 10 to 30 carbon atoms, which may have a substituent, bonded to said recurring unit by a covalent bond or an ionic bond; and an orthonitrobenzyl group, which may have a substituent, contained on at least 5% of said recurring units.

2. The photosensitive amphiphilic high polymer as claimed in claim 1, wherein at least one of $R^1$ and $R^2$ is a group of benzenoid structure having at least 6 carbon atoms.

3. The photosensitive amphiphilic high polymer as claimed in claim 1, wherein the recurring unit has a precursor structure capable of forming a 5-membered or 6-membered ring containing a hetero atom.

4. The photosensitive amphiphilic high polymer as claimed in claim 2, wherein the recurring unit has a precursor structure capable of forming a 5-membered or 6-membered ring containing a hetero atom.

5. The photosensitive amphiphilic high polymer as claimed in claim 1, wherein the high polymer has the recurring unit having the formula (1) or (2)

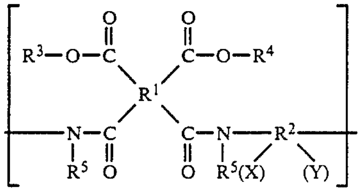

(1)

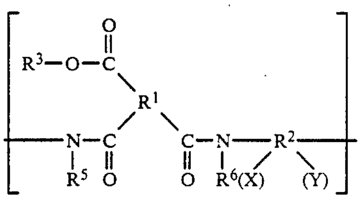

(2)

wherein $R^1$ represents a tetravalent or trivalent group having at least 2 carbon atoms, $R^2$ represents a divalent, trivalent, or tetravalent group having at least 2 carbon atoms, and at least one of $R^1$ and $R^2$ is a group of benzenoid structure having at least 6 carbon atoms;

X and Y each represents an acid group or a basic group containing a hetero atom, which may have a substituent;

when $R^2$ is trivalent, X is bonded to $R^2$ and when $R^2$ is tetravalent, X and Y are bonded to $R^2$; and $R^3$, $R^4$, $R^5$ and $R^6$ each represents a monovalent hydrocarbon group having 1 to 30 carbon atoms, a hydrogen atom, or a nitrobenzyl group, which may have a substituent.

6. The photosensitive amphiphilic high polymer as claimed in claim 5, which has the recurring unit of formula (1).

7. The photosensitive amphiphilic high polymer as claimed in claim 5, which has the recurring unit of formula (2).

8. The photosensitive amphiphilic high polymer as claimed in claim 5, wherein at least one of $R^3$ and $R^4$ is an orthonitrobenzyl group of the formula

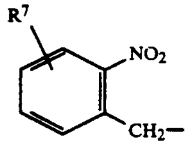

wherein $R^7$ represents a hydrocarbon group having 1 to 30 carbon atoms, which may have a substituent, or a hydrogen atom.

9. The photosensitive amphiphilic high polymer as claimed in claim 5, wherein $R^5$ and $R^6$ are each a hydrogen atom.

10. A film formed by a Langmuir-Blodgett technique comprising a photosensitive amphiphilic high polymer comprising a linear recurring unit containing at least divalent 1st organic group ($R^1$) having at least two carbon atoms and at least divalent 2nd organic group ($R^2$) having at least two carbon atoms, said organic groups $R^1$ and $R^2$ being connected to each other by a divalent linkage group formed by a reaction of an acid group (A) containing a hetero atom and a basic group (B) containing a hetero group; and at least one hydrocarbon-containing group having 10 to 30 carbon atoms, which may have a substituent, bonded to said recurring unit by a covalent bond or an ionic bond; and a dimerizable or polymerizable unsaturated bond or an orthonitrobenzyl group,

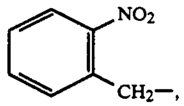

which may have a substituent, contained on at least 5% of said recurring units.

* * * * *